US012672585B2

(12) United States Patent
Li et al.

(10) Patent No.: US 12,672,585 B2
(45) Date of Patent: Jun. 30, 2026

(54) PACKAGE COMPRISING AN INTEGRATED DEVICE, A CHIPLET AND A METALLIZATION PORTION

(71) Applicant: QUALCOMM Incorporated, San Diego, CA (US)

(72) Inventors: Xia Li, San Diego, CA (US); Xuefeng Zhang, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 788 days.

(21) Appl. No.: 17/952,163

(22) Filed: Sep. 23, 2022

(65) Prior Publication Data

US 2024/0105688 A1     Mar. 28, 2024

(51) Int. Cl.
H10W 90/00     (2026.01)
H10W 70/60     (2026.01)
(Continued)

(52) U.S. Cl.
CPC .......... H10W 90/00 (2026.01); H10W 70/611 (2026.01); H10W 70/65 (2026.01);
(Continued)

(58) Field of Classification Search
CPC ............. H01L 25/105; H01L 23/49816; H01L 23/49833; H01L 23/49838; H01L 23/5381; H01L 23/5385; H01L 23/5386; H01L 24/08; H01L 24/16; H01L 2224/08145; H01L 2224/08235; H01L 2224/16146; H01L 2224/16227; H01L 2224/16235; H01L 2224/16238; H01L 2225/1023; H01L 2225/1041; H01L 2225/1058; H01L 2225/107; H01L 2924/182; H01L 2924/37001; H01L 2225/06524; H01L 2225/06541; H01L 2225/06548; H01L 23/5389; H01L 25/03; H01L 25/50; H01L 25/0652; H10W 90/00; H10W 70/611; H10W 70/65; H10W 90/401; H10W 90/701; H10W 70/60; H10W 74/00;
(Continued)

(56) References Cited

U.S. PATENT DOCUMENTS

2013/0075903 A1*   3/2013   Pagaila ................. H01L 21/561
                                                                 257/737
2016/0141234 A1    5/2016   We et al.
(Continued)

OTHER PUBLICATIONS

International Search Report and Written Opinion—PCT/US2023/071768—ISA/EPO—Oct. 27, 2023.

*Primary Examiner* — Marlon T Fletcher
*Assistant Examiner* — Christina A Sylvia
(74) *Attorney, Agent, or Firm* — Loza & Loza, LLP

(57) ABSTRACT

A package comprising a substrate comprising at least one dielectric layer and a plurality of interconnects, a first chiplet coupled to the substrate, a second chiplet coupled to the first chiplet, an encapsulation layer coupled to the substrate, the first chiplet and the second chiplet, a plurality of encapsulation interconnects located in the encapsulation layer, a metallization portion coupled to the encapsulation layer, the second chiplet and the plurality of encapsulation interconnects and a first integrated device coupled to the metallization portion.

20 Claims, 31 Drawing Sheets

CROSS SECTIONAL PROFILE VIEW

(51) Int. Cl.
*H10W 70/65* (2026.01)
*H10W 74/00* (2026.01)

(52) U.S. Cl.
CPC ....... *H10W 90/401* (2026.01); *H10W 90/701*
(2026.01); *H10W 70/60* (2026.01); *H10W*
*74/00* (2026.01); *H10W 90/722* (2026.01);
*H10W 90/724* (2026.01); *H10W 90/792*
(2026.01); *H10W 90/794* (2026.01)

(58) Field of Classification Search
CPC ............. H10W 90/722; H10W 90/724; H10W
90/792; H10W 90/794; H10W 70/618;
H10W 80/00; H10W 72/823; H10W
90/20; H10W 90/297; H10W 70/614;
H10W 70/635; H10W 72/20; H10W
72/90
See application file for complete search history.

(56) References Cited

U.S. PATENT DOCUMENTS

| | | | |
|---|---|---|---|
| 2017/0186837 | A1 | 6/2017 | Yen et al. |
| 2017/0207197 | A1* | 7/2017 | Yu ........................... H01L 24/14 |
| 2018/0102311 | A1* | 4/2018 | Shih ................... H10W 70/611 |
| 2019/0006316 | A1* | 1/2019 | Yu ...................... H01L 25/0657 |
| 2019/0109117 | A1* | 4/2019 | Fang .................... H01L 21/568 |
| 2020/0161235 | A1* | 5/2020 | Kwon ................... H10D 1/716 |
| 2020/0176384 | A1* | 6/2020 | Wu ........................ H10P 72/74 |
| 2021/0175178 | A1 | 6/2021 | We et al. |
| 2021/0217727 | A1 | 7/2021 | Kurita |
| 2021/0351145 | A1 | 11/2021 | Patil et al. |
| 2021/0358875 | A1 | 11/2021 | Lee et al. |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

TRENCH CAPACITOR DEVICE

*CROSS SECTIONAL PROFILE VIEW*

INTEGRATED DEVICE(S) COUPLING

ENCAPSULATION FORMATION

CARRIER DECOUPLING

SUBSTRATE COUPLING

280

109

140

108

107

120

102

⑪

SOLDER INTERCONNECT

INTERCONNECT FORMATION

INTERGRATED DEVICES COUPLING

METALLIZATION PORTION FORMATION

*FIG. 17B*

METALLIZATION PORTION FORMATION

106

104

160

162

109

107

9

CARRIER DECOUPLING

104

106

109

408

107

10

1900

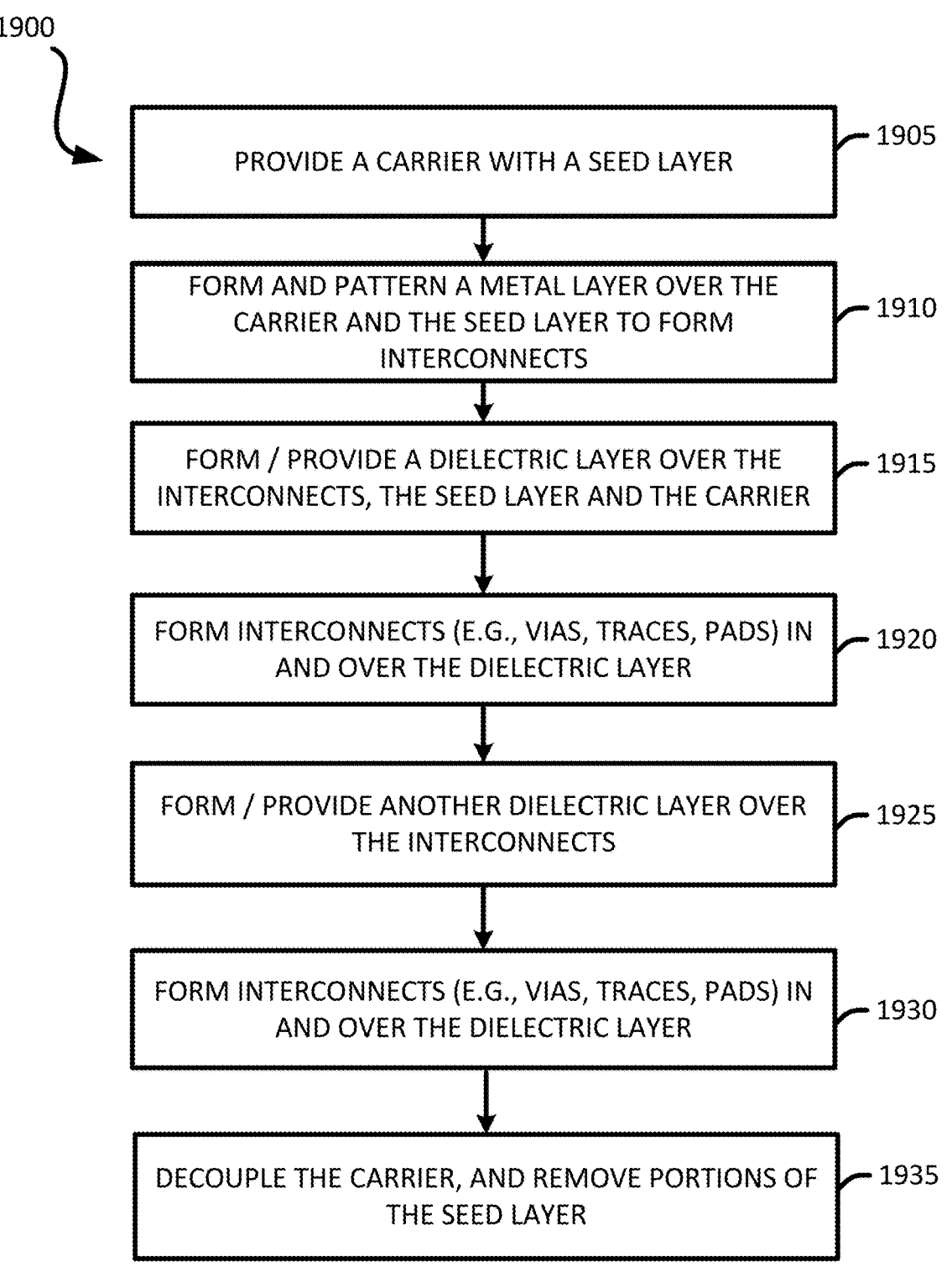

PROVIDE A CARRIER WITH A SEED LAYER — 1905

FORM AND PATTERN A METAL LAYER OVER THE CARRIER AND THE SEED LAYER TO FORM INTERCONNECTS — 1910

FORM / PROVIDE A DIELECTRIC LAYER OVER THE INTERCONNECTS, THE SEED LAYER AND THE CARRIER — 1915

FORM INTERCONNECTS (E.G., VIAS, TRACES, PADS) IN AND OVER THE DIELECTRIC LAYER — 1920

FORM / PROVIDE ANOTHER DIELECTRIC LAYER OVER THE INTERCONNECTS — 1925

FORM INTERCONNECTS (E.G., VIAS, TRACES, PADS) IN AND OVER THE DIELECTRIC LAYER — 1930

DECOUPLE THE CARRIER, AND REMOVE PORTIONS OF THE SEED LAYER — 1935

*FIG. 19*

PACKAGE COMPRISING AN INTEGRATED DEVICE, A CHIPLET AND A METALLIZATION PORTION

FIELD

Various features relate to a package comprising an integrated device, a chiplet and a metallization portion.

BACKGROUND

A package may include a substrate, an integrated device and a passive device. These components are coupled together to provide a package that may perform various electrical functions. How the integrated device, the substrate and the passive device are coupled together affects how the package performs overall. There is an ongoing need to provide better performing packages.

SUMMARY

Various features relate to a package comprising an integrated device, a chiplet and a metallization portion.

One example provides a package comprising a substrate comprising at least one dielectric layer and a plurality of interconnects, a first chiplet coupled to the substrate, a second chiplet coupled to the first chiplet, an encapsulation layer coupled to the substrate, the first chiplet and the second chiplet, a plurality of encapsulation interconnects located in the encapsulation layer, a metallization portion coupled to the encapsulation layer, the second chiplet and the plurality of encapsulation interconnects and a first integrated device coupled to the metallization portion.

Another example provides a package comprising a first metallization portion, a first chiplet coupled to the first metallization portion, an encapsulation layer coupled to the first metallization portion, the first chiplet, a plurality of encapsulation interconnects located in the encapsulation layer, a second metallization portion coupled to the encapsulation layer, the first chiplet, and the plurality of encapsulation interconnects and a second chiplet coupled to the second metallization portion, a first integrated device coupled to the second chiplet and the second metallization portion such that the second chiplet is located between the first integrated device and the second metallization portion, wherein the first integrated device is coupled to the second chiplet through a plurality of solder interconnects.

Another example provides a package comprising a substrate comprising at least one dielectric layer and a plurality of interconnects, a bridge located in the substrate, a first chiplet coupled to the substrate, a second chiplet, an encapsulation layer coupled to the substrate, the first chiplet and the second chiplet, a plurality of encapsulation interconnects located in the encapsulation layer, a metallization portion coupled to the encapsulation layer, the second chiplet and the plurality of encapsulation interconnects; and a first integrated device coupled to the metallization portion.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 16A-16D illustrate an exemplary sequence for fabricating a package comprising multiple integrated devices, and a metallization portion.

FIGS. 17A-17D illustrate an exemplary sequence for fabricating a package comprising multiple integrated devices, and a metallization portion.

FIG. 19 illustrates an exemplary flow diagram of a method for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate comprising at least one dielectric layer and a plurality of interconnects, a first chiplet coupled to the substrate, a second chiplet coupled to the first chiplet, an encapsulation layer coupled to the substrate, the first chiplet and the second chiplet, a plurality of encapsulation interconnects located in the encapsulation layer, a metallization portion coupled to the encapsulation layer, the second chiplet and the plurality of encapsulation interconnects and a first integrated device coupled to the metallization portion. The package may provide a configuration with reduce electrical paths between components. Reducing the electrical paths between the first integrated device, the first chiplet, the second integrated device and/or the second chiplet, help reduce latency in signals and/or currents which can help improve the performance of the package. As will be further described below, instead of one integrated device that performs all the functions of a package, various functions of the package are performed by different integrated devices and/or different chiplets. By redistributing the functions of the package to various integrated devices and/or various chiplets, cost savings in fabricating the package may be achieved, while still providing a package with high performance capabilities.

Exemplary Package Comprising an Integrated Device and a Chiplet

Figure 1:
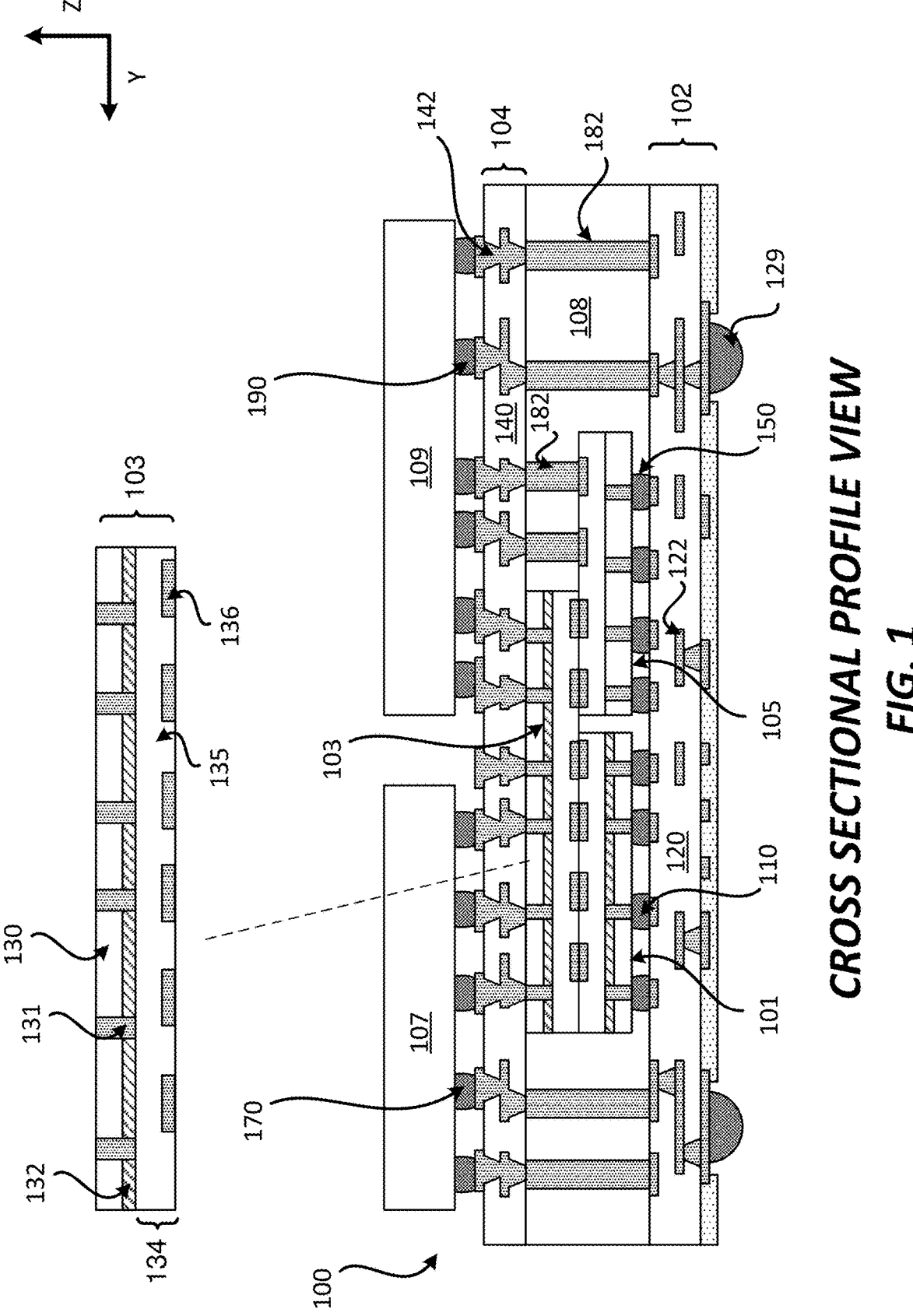
FIG. 1 illustrates a cross sectional profile view of a package comprising an integrated device, a metallization portion and a chiplet.

FIG. 1 illustrates a cross sectional profile view of a package 100 that includes an integrated device and a chiplet. The package 100 includes a substrate 102, a metallization portion 104, an integrated device 107, an integrated device 109, a chiplet 101, a chiplet 103, a chiplet 105, an encapsulation layer 108, and a plurality of encapsulation interconnects 182.

The substrate 102 includes at least one dielectric layer 120 and a plurality of interconnects 122. The substrate 102 may be a package substrate. The chiplet 101 is coupled to the substrate 102 through a plurality of solder interconnects 110, such that a back side of the chiplet 101 faces towards the substrate 102. The chiplet 105 is coupled to the substrate 102 through a plurality of solder interconnects 150, such that a back side of the chiplet 105 faces towards the substrate 102. The chiplet 103 is coupled to the chiplet 101 and the chiplet 105, such that a front side of the chiplet 103 faces a front side of the chiplet 101 and a front side of the chiplet 105. A plurality of solder interconnects 129 are coupled to the substrate 102. The plurality of solder interconnects 129 are coupled to the plurality of interconnects 122.

The encapsulation layer 108 is coupled to the substrate 102, the chiplet 101, the chiplet 103 and the chiplet 105. The encapsulation layer 108 may encapsulate the chiplet 101, the chiplet 103, the chiplet 105 and the plurality of encapsulation interconnects 182. The metallization portion 104 is coupled to the encapsulation layer 108 and the back side of the chiplet 103. The metallization portion 104 is also coupled to the plurality of encapsulation interconnects 182. The metallization portion 104 includes at least one dielectric layer 140 (e.g., metallization dielectric layer) and a plurality of metallization interconnects 142. The plurality of encapsulation interconnects 182 may be coupled to the metallization portion 104 and the front side of the chiplet 105. The chiplet 101, the chiplet 103 and the chiplet 105 are located between the substrate 102 and the metallization portion 104.

The integrated device 107 is coupled to a surface of the metallization portion 104 through a plurality of solder interconnects 170. The integrated device 109 is coupled to a surface of the metallization portion 104 through a plurality of solder interconnects 190.

The chiplet 103 includes a die substrate 130, a plurality of through substrate vias 131, an active region 132, and a die interconnection portion 134. The die interconnection portion 134 includes at least one dielectric layer 135 (e.g., die dielectric layer) and a plurality of die interconnects 136. The active region 132 may located in and/or over the die substrate 130. The active region 132 may include transistors and/or logical cells. The plurality of through substrate vias 131 may extend through a thickness of the die substrate 130. The plurality of through substrate vias 131 may be coupled to the plurality of die interconnects 136. The plurality of through substrate vias 131 may be coupled to the active region 132. For example, the plurality of through substrate vias 131 may be coupled to one or more transistors and/or one more logical cells. The chiplet 103 may have a front side and a back side. The front side of the chiplet 103 may be a side that includes the die interconnection portion 134, and the back side of the chiplet 103 may be a side that includes the die substrate 130. An electrical path through the chiplet 103 may include the plurality of through substrate vias 131, the active region 132 and/or the plurality of die interconnects 136. Thus, as described in the disclosure, when an electrical path include a chiplet, the electrical path may include at least one through substrate via, an active region of the chiplet and/or at least one die interconnects. Other chiplets described in the disclosure may be similar to the chiplet 103 and thus may include the same or similar components, configuration and/or structures. In some implementations, a chiplet may be free of transistors and/or logical cells. Moreover, as described in at least FIG. 13, a chiplet may include a deep trench capacitor.

The chiplet 101 may be similar to the chiplet 103. For example, the chiplet 101 may also include a die substrate, a plurality of through substrate vias, an active region, and a die interconnection portion, where the die interconnection portion of the chiplet 101 includes at least one dielectric layer and a plurality of die interconnects.

The chiplet 105 may be similar to the chiplet 103. For example, the chiplet 105 may also include a die substrate, a plurality of through substrate vias, and a die interconnection portion, where the die interconnection portion of the chiplet 105 includes at least one dielectric layer and a plurality of die interconnects. The chiplet 105 may be free of transistors and/or logical cells.

The configuration and arrangement shown in FIG. 1, provides several ways through which one or more electrical paths may extend.

An electrical path between the integrated device 107 and the integrated device 109 may include at least one solder interconnect from the plurality of solder interconnects 170, at least one metallization interconnect from the plurality of metallization interconnects 142, at least one solder interconnect from the plurality of solder interconnects 190.

An electrical path between an integrated device (e.g., 107, 109) and the substrate 102 may include at least one interconnect from the plurality of interconnects 122, at least one encapsulation interconnect from the plurality of encapsulation interconnects 182, at least one metallization interconnect from the plurality of metallization interconnects 142, and at least one solder interconnect from the plurality of solder interconnects (e.g., 170, 190).

An electrical path between an integrated device (e.g., 107, 109) and the substrate 102 may include at least one interconnect from the plurality of interconnects 122, the chiplet 101, the chiplet 103, at least one metallization interconnect from the plurality of metallization interconnects 142, and at least one solder interconnect from the plurality of solder interconnects (e.g., 170, 190).

An electrical path between an integrated device (e.g., 107, 109) and the substrate 102 may include at least one interconnect from the plurality of interconnects 122, the chiplet 105, the chiplet 103, at least one metallization interconnect from the plurality of metallization interconnects 142, and at least one solder interconnect from the plurality of solder interconnects (e.g., 170, 190).

An electrical path between an integrated device (e.g., 107, 109) and the substrate 102 may include at least one interconnect from the plurality of interconnects 122, the chiplet 105, at least one encapsulation interconnect from the plurality of encapsulation interconnects 182, at least one metallization interconnect from the plurality of metallization interconnects 142, and at least one solder interconnect from the plurality of solder interconnects (e.g., 170, 190).

The chiplet 101, the chiplet 105, and/or the chiplet 103 may utilize any of the electrical paths described above to be electrically coupled to the integrated device 107 and/or the integrated device 109. As described above, an electrical path that includes a chiplet (e.g., that passes through a chiplet) may include die interconnects and/or through substrate vias.

In some implementations, an electrical path between an integrated device (e.g., 107, 109) and the chiplet 101 may include at least one solder interconnect from the plurality of solder interconnects 110, at least one interconnect from the plurality of interconnects 122, at least one encapsulation interconnect from the plurality of encapsulation interconnects 182, at least one metallization interconnect from the plurality of metallization interconnects 142, and at least one solder interconnect from the plurality of solder interconnects (e.g., 170, 190).

In some implementations, an electrical path between an integrated device (e.g., 107, 109) and the chiplet 105 may include at least one solder interconnect from the plurality of solder interconnects 150, at least one interconnect from the plurality of interconnects 122, at least one encapsulation interconnect from the plurality of encapsulation interconnects 182, at least one metallization interconnect from the plurality of metallization interconnects 142, and at least one solder interconnect from the plurality of solder interconnects (e.g., 170, 190).

As will be further described below, the orientation of the chiplet 101, the chiplet 103 and/or the chiplet 105 in a package may be rearranged for different implementations. In some implementations, a first chiplet may be coupled to a second chiplet such that the front side of the first chiplet faces the front side of the second chiplet. In some implementations, a first chiplet may be coupled to a second chiplet such that the front side of the first chiplet faces the back side of the second chiplet. In some implementations, a first chiplet may be coupled to a second chiplet such that the back side of the first chiplet faces the back side of the second chiplet. Thus, in the disclosure, any chiplet may be coupled to another chiplet, front to front, back to back or front to back. A chiplet may be coupled to another chiplet through hybrid bonding, where interconnect from one chiplet is directly touching interconnects from another chiplet. Moreover, in the disclosure, any chiplet may be coupled to a substrate or a metallization portion through the front side of the chiplet or through the back side of the chiplet. Thus, the figures in the disclosure are merely examples of the many ways that one or more chiplets may be coupled to another component of a package.

Figure 2:
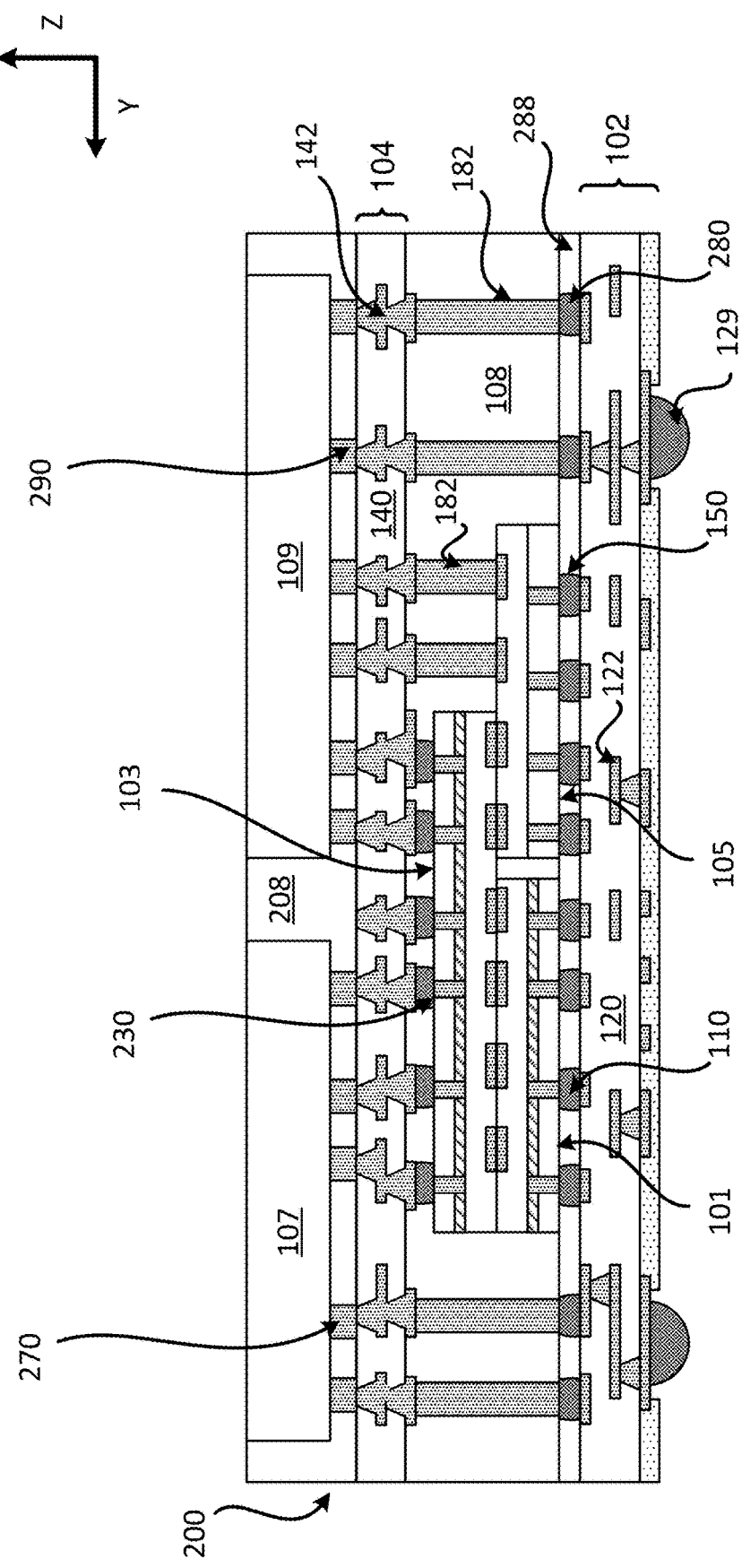
FIG. 2 illustrates a cross sectional profile view of a package comprising an integrated device, a metallization portion and a chiplet.

FIG. 2 illustrates a cross sectional profile view of a package 200 that includes an integrated device and a chiplet.

The package 200 includes a substrate 102, a metallization portion 104, an integrated device 107, an integrated device 109, a chiplet 101, a chiplet 103, a chiplet 105, an encapsulation layer 108, a plurality of encapsulation interconnects 182. The plurality of encapsulation interconnects 182 is coupled to the substrate 102 through the plurality of solder interconnects 280.

The chiplet 101 is coupled to the substrate 102 through a plurality of solder interconnects 110, such that a back side of the chiplet 101 faces the substrate 102. The chiplet 105 is coupled to the substrate 102 through a plurality of solder interconnects 150, such that a back side of the chiplet 105 faces the substrate 102. The chiplet 103 is coupled to the chiplet 101 and the chiplet 105, such that a front side of the chiplet 103 faces a front side of the chiplet 101 and a front side of the chiplet 105. A plurality of solder interconnects 129 are coupled to the substrate 102. The plurality of solder interconnects 129 are coupled to the plurality of interconnects 122.

The encapsulation layer 108 is coupled to the substrate 102, the chiplet 101, the chiplet 103 and the chiplet 105. The encapsulation layer 108 may encapsulate the chiplet 101, the chiplet 103, the chiplet 105 and the plurality of encapsulation interconnects 182. The metallization portion 104 is coupled to the encapsulation layer 108 and the back side of the chiplet 103. The metallization portion 104 is also coupled to the plurality of encapsulation interconnects 182. The metallization portion 104 includes at least one dielectric layer 140 (e.g., metallization dielectric layer) and a plurality of metallization interconnects 142. The plurality of encapsulation interconnects 182 may be coupled to the metallization portion 104 and the front side of the chiplet 105. The back side of the chiplet 103 is coupled to the metallization portion 104 through a plurality of solder interconnects 230. The package 200 also includes an encapsulation layer 288 that is located between the encapsulation layer 108 and the substrate 102. The encapsulation layer 288 may be considered part of the encapsulation layer 108. The encapsulation layer 288 may encapsulate the plurality of solder interconnects 110, the plurality of solder interconnects 150 and/or the plurality of solder interconnects 280.

The integrated device 107 is coupled to the a surface of the metallization portion 104 through a plurality of pillar interconnects 270. The integrated device 109 is coupled to the a surface of the metallization portion 104 through a plurality of pillar interconnects 290.

An electrical path between the integrated device 107 and the integrated device 109 may include at least one pillar interconnect from the plurality of pillar interconnects 270, at least one metallization interconnect from the plurality of metallization interconnects 142, at least one pillar interconnect from the plurality of pillar interconnects 290.

An electrical path between an integrated device (e.g., 107, 109) and the substrate 102 may include at least one interconnect from the plurality of interconnects 122, at least one encapsulation interconnect from the plurality of encapsulation interconnects 182, at least one metallization interconnect from the plurality of metallization interconnects 142, and at least one pillar interconnect from the plurality of solder interconnects (e.g., 270, 290).

An electrical path between an integrated device (e.g., 107, 109) and the substrate 102 may include at least one interconnect from the plurality of interconnects 122, the chiplet 101, the chiplet 103, at least one solder interconnect from the plurality of solder interconnects 230, at least one metallization interconnect from the plurality of metallization interconnects 142, and at least one pillar interconnect from the plurality of pillar interconnects (e.g., 270, 290).

An electrical path between an integrated device (e.g., 107, 109) and the substrate 102 may include at least one interconnect from the plurality of interconnects 122, the chiplet 105, the chiplet 103, at least one solder interconnect from the plurality of solder interconnects 230, at least one metallization interconnect from the plurality of metallization interconnects 142, and at least one pillar interconnect from the plurality of pillar interconnects (e.g., 270, 290).

An electrical path between an integrated device (e.g., 107, 109) and the substrate 102 may include at least one interconnect from the plurality of interconnects 122, the chiplet 105, at least one encapsulation interconnect from the plurality of encapsulation interconnects 182, at least one metallization interconnect from the plurality of metallization interconnects 142, and at least one pillar interconnect from the plurality of pillar interconnects (e.g., 270, 290).

Figure 3:
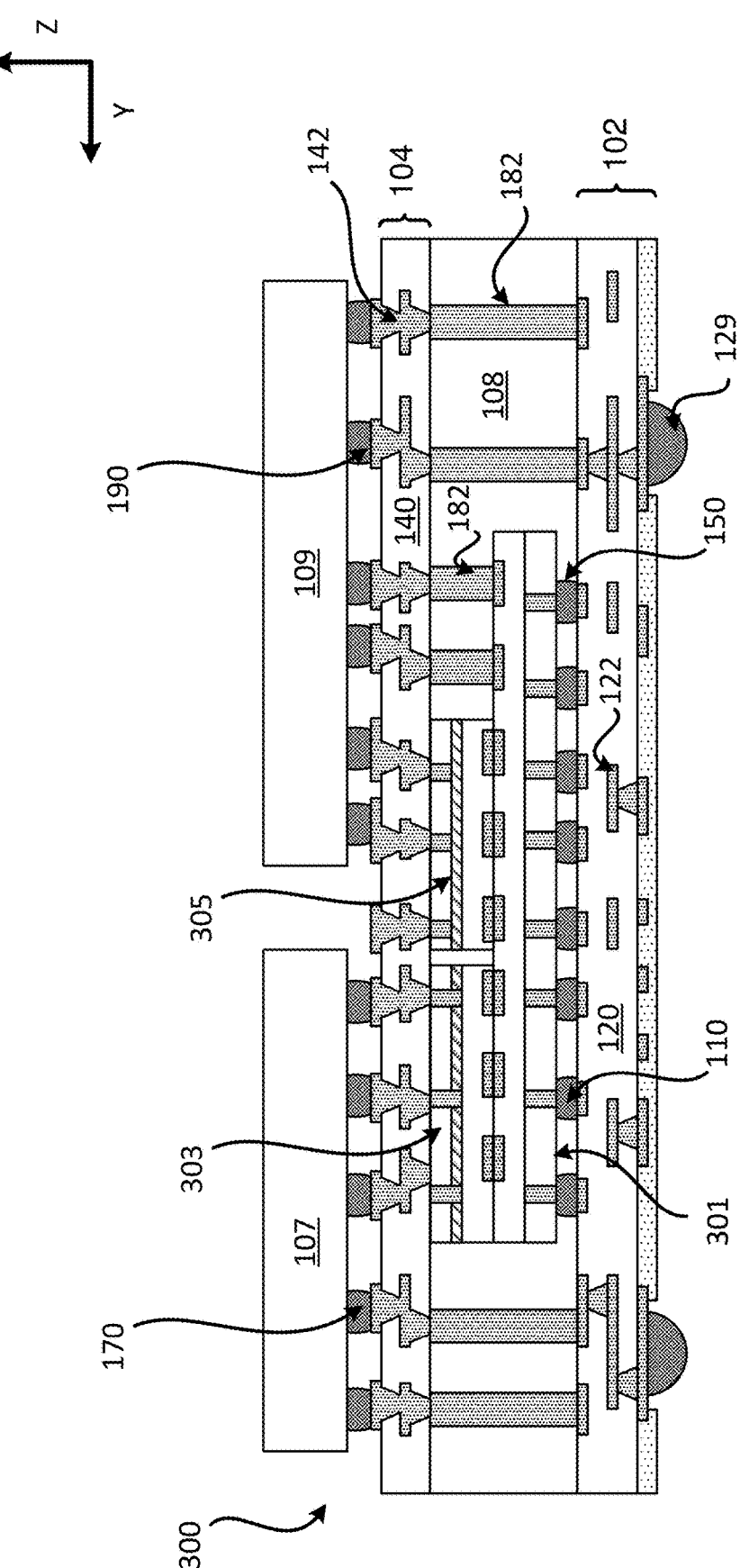
FIG. 3 illustrates a cross sectional profile view of a package comprising an integrated device, a metallization portion and a chiplet.

FIG. 3 illustrates a cross sectional profile view of a package 300 that includes an integrated device and a chiplet. The package 300 includes a substrate 102, a metallization portion 104, an integrated device 107, an integrated device 109, a chiplet 301, a chiplet 303, a chiplet 305, an encapsulation layer 108, and a plurality of encapsulation interconnects 182.

The chiplet 301 is coupled to the substrate 102 through a plurality of solder interconnects 110, such that a back side of the chiplet 301 faces the substrate 102. The chiplet 305 is coupled to the metallization portion 104 such that a back side of the chiplet 305 faces the metallization portion 104. The chiplet 305 is also coupled to the chiplet 301 such that the front side of the chiplet 305 faces the front side of the chiplet 301. The chiplet 303 is coupled to the chiplet 301 and the metallization portion 104, such that the front side of the chiplet 303 faces the front side of the chiplet 301, and the back side of the chiplet 303 faces the metallization portion 104. The chiplet 301, the chiplet 303 and the chiplet 305 are located between the substrate 102 and the metallization portion 104. A plurality of solder interconnects 129 are coupled to the substrate 102. The plurality of solder interconnects 129 are coupled to the plurality of interconnects 122.

The encapsulation layer 108 is coupled to the substrate 102, the chiplet 301, the chiplet 303 and the chiplet 305. The encapsulation layer 108 may encapsulate the chiplet 301, the chiplet 303, the chiplet 305 and the plurality of encapsulation interconnects 182. The metallization portion 104 is coupled to the encapsulation layer 108 and the back side of the chiplet 303 and the back side of the chiplet 305. The metallization portion 104 is also coupled to the plurality of encapsulation interconnects 182. The metallization portion 104 includes at least one dielectric layer 140 (e.g., metallization dielectric layer) and a plurality of metallization interconnects 142. The plurality of encapsulation interconnects 182 may be coupled to the metallization portion 104 and the front side of the chiplet 301.

The integrated device 107 is coupled to the a surface of the metallization portion 104 through a plurality of solder interconnects 170. The integrated device 109 is coupled to the a surface of the metallization portion 104 through a plurality of solder interconnects 190.

The chiplet 303 may be similar to the chiplet 103. For example, the chiplet 301 may also include a die substrate, a plurality of through substrate vias, an active region, and a die interconnection portion, where the die interconnection portion of the chiplet 303 includes at least one dielectric layer and a plurality of die interconnects.

The chiplet 305 may be similar to the chiplet 103. For example, the chiplet 301 may also include a die substrate, a plurality of through substrate vias, an active region, and a die interconnection portion, where the die interconnection portion of the chiplet 305 includes at least one dielectric layer and a plurality of die interconnects.

The chiplet 301 may be similar to the chiplet 103. For example, the chiplet 105 may also include a die substrate, a plurality of through substrate vias, and a die interconnection portion, where the die interconnection portion of the chiplet 301 includes at least one dielectric layer and a plurality of die interconnects. The chiplet 301 may be free of transistors and/or logical cells.

An electrical path between an integrated device (e.g., 107, 109) and the substrate 102 may include at least one interconnect from the plurality of interconnects 122, the chiplet 301, the chiplet 303, at least one metallization interconnect from the plurality of metallization interconnects 142, and at least one solder interconnect from the plurality of solder interconnects (e.g., 170, 190).

An electrical path between an integrated device (e.g., 107, 109) and the substrate 102 may include at least one interconnect from the plurality of interconnects 122, a chiplet 301, a chiplet 305, at least one metallization interconnect from the plurality of metallization interconnects 142, and at least one solder interconnect from the plurality of solder interconnects (e.g., 170, 190).

An electrical path between an integrated device (e.g., 107, 109) and the substrate 102 may include at least one interconnect from the plurality of interconnects 122, a chiplet 301, at least one encapsulation interconnect from the plurality of encapsulation interconnects 182, at least one metallization interconnect from the plurality of metallization interconnects 142, and at least one solder interconnect from the plurality of solder interconnects (e.g., 170, 190).

An electrical path between the substrate 102 and the metallization portion 104 may extend through the chiplet 301 and the chiplet 303. The electrical path may extend through the back side of the chiplet 301, through the front side of the chiplet 301, through the front side of the chiplet 303 and through the back side of the chiplet 303.

An electrical path between the substrate 102 and the metallization portion 104 may extend through the chiplet 301 and the chiplet 305. The electrical path may extend through the back side of the chiplet 301, through the front side of the chiplet 301, through the front side of the chiplet 305 and through the back side of the chiplet 305.

An electrical path between the substrate 102 and the metallization portion 104 may extend through the chiplet 301 and an encapsulation interconnect from the plurality of encapsulation interconnects 182. The electrical path may extend through the back side of the chiplet 301, through the front side of the chiplet 301, and through an encapsulation interconnect from the plurality of encapsulation interconnects 182

Figure 4:
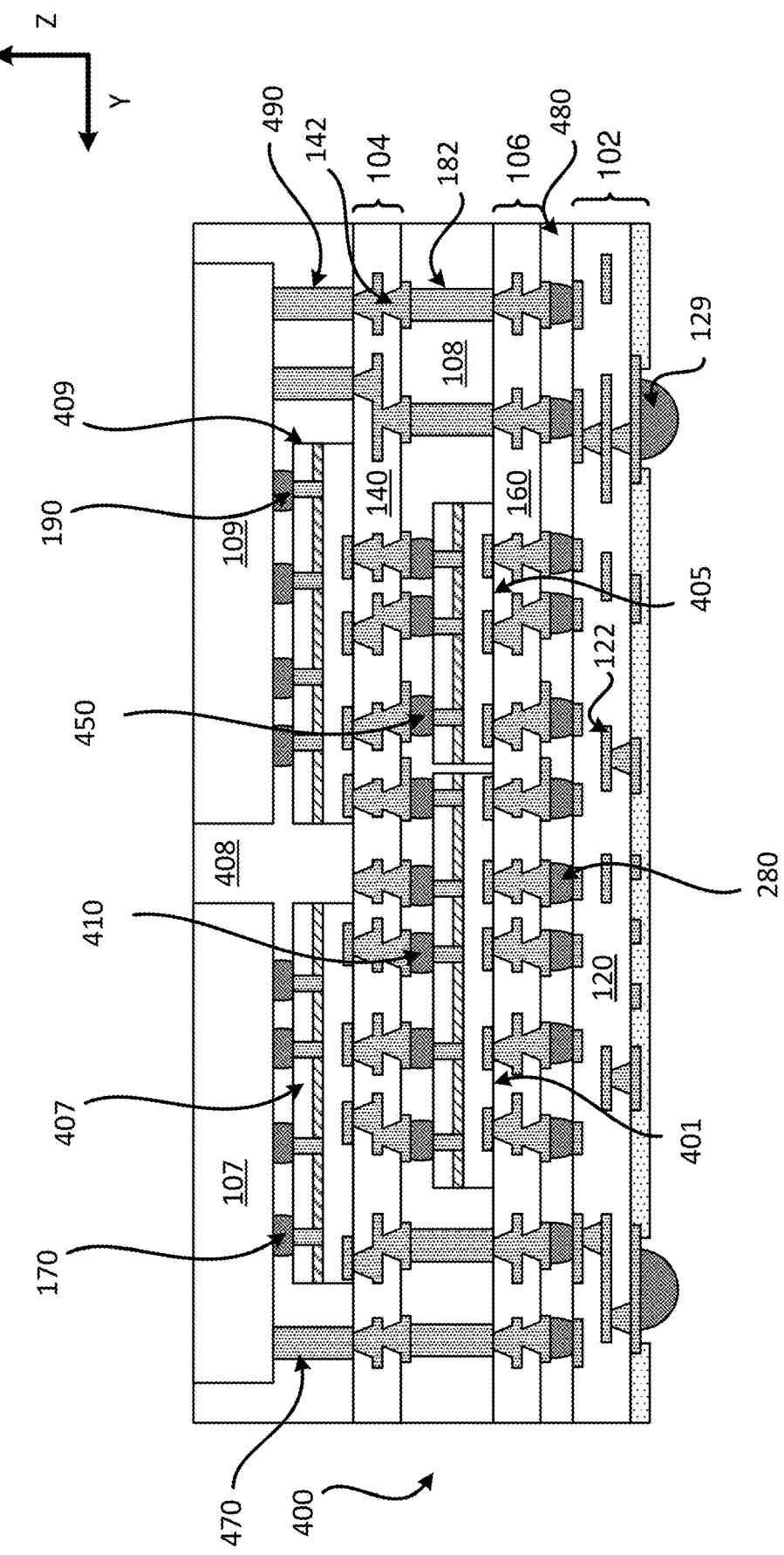
FIG. 4 illustrates a cross sectional profile view of a package comprising an integrated device, a metallization portion and a chiplet.

FIG. 4 illustrates a package 400 that includes a substrate 102, a metallization portion 104, a metallization portion 106, an encapsulation layer 108, an integrated device 107, an integrated device 109, a chiplet 401, a chiplet 405, a chiplet 407, a chiplet 409, a plurality of encapsulation interconnects 182, a plurality of encapsulation interconnects 482, and/or an encapsulation layer 408, and an encapsulation layer 480.

The chiplet 401 and the chiplet 405 are located between the metallization portion 104 and the metallization portion 106. A back side of the chiplet 401 is coupled to the metallization portion 104 through a plurality of solder interconnects 410. A back side of the chiplet 405 is coupled to the metallization portion 104 through a plurality of solder interconnects 450. The chiplet 401 and the chiplet 405 are coupled to the metallization portion 106 such that the front side of the chiplet 401 and the front side of the chiplet 405 faces the metallization portion 106. The chiplet 401 and the chiplet 405 are coupled to the metallization portion 106 such that the back side of the chiplet 401 and the back side of the chiplet 405 faces the metallization portion 104. The encapsulation layer 480 is located between the metallization portion 106 and the substrate 102.

The chiplet 407 and the chiplet 409 are coupled to the metallization portion 104 such that the front side of the chiplet 407 and the front side of the chiplet 409 face the metallization portion 104. The chiplet 407 is coupled to the integrated device 107 through a plurality of solder interconnects 170 such that the back side of the chiplet 407 faces the integrated device 107. The chiplet 409 is coupled to the integrated device 109 through a plurality of solder interconnects 190 such that the back side of the chiplet 409 faces the integrated device 109. The integrated device 107 is coupled to the metallization portion 104 through a plurality of pillar interconnects 470. The integrated device 109 is coupled to the metallization portion 104 through a plurality of pillar interconnects 490.

The encapsulation layer 408 is coupled to the metallization portion 104, the integrated device 107, the integrated device 109, the chiplet 407 and the chiplet 409. The encapsulation layer 408 may encapsulate the integrated device 107, the integrated device 109, the chiplet 407, the chiplet 409, the plurality of pillar interconnects 470 and the plurality of pillar interconnects 490.

An electrical path between the metallization portion 104 and the integrated device 107 may include a solder interconnect from the plurality of solder interconnects 170, the chiplet 407, and a metallization interconnect from the plurality of metallization interconnects 142. An electrical path between the metallization portion 104 and the integrated device 107 may include a pillar interconnect from the plurality of pillar interconnects 470 and a metallization interconnect from the plurality of metallization interconnects 142.

An electrical path between the metallization portion 104 and the integrated device 109 may include a solder interconnect from the plurality of solder interconnects 190, the chiplet 409, and a metallization interconnect from the plurality of metallization interconnects 142. An electrical path between the metallization portion 104 and the integrated device 109 may include a pillar interconnect from the plurality of pillar interconnects 490 and a metallization interconnect from the plurality of metallization interconnects 142.

Figure 5:
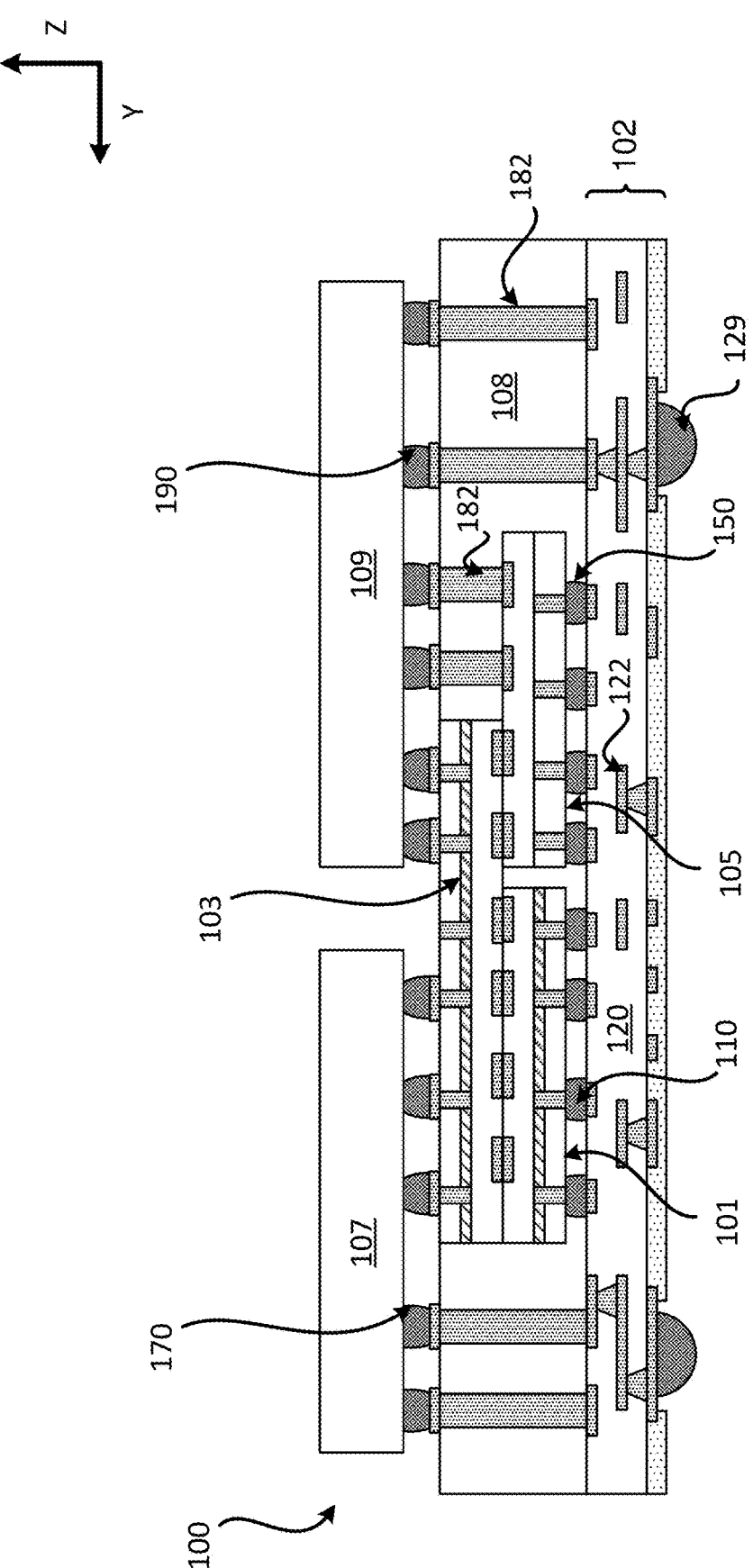
FIG. 5 illustrates a cross sectional profile view of a package comprising an integrated device, a metallization portion and a chiplet.

FIG. 5 illustrates a cross sectional profile view of a package 500 that includes an integrated device and a chiplet. The package 500 is similar to the package 100. However, the package 500 does not include the metallization portion 104 of the package 100. The package 500 includes the substrate 102, the integrated device 107, the integrated device 109, a chiplet 101, a chiplet 103, a chiplet 105, an encapsulation layer 108, a plurality of encapsulation interconnects 182.

The encapsulation layer 108 is coupled to the substrate 102, the chiplet 101, the chiplet 103 and the chiplet 105. The encapsulation layer 108 may encapsulate the chiplet 101, the chiplet 103, the chiplet 105 and the plurality of encapsulation interconnects 182.

The integrated device 107 is coupled to the chiplet 103 and the plurality of encapsulation interconnects 182 through a plurality of solder interconnects 170. The integrated device

109 is coupled to the chiplet 103 and the plurality of encapsulation interconnects 182 through a plurality of solder interconnects 190.

An electrical path between the substrate 102 and the integrated device 107 may include the chiplet 101, the chiplet 103 and at least one solder interconnect from the plurality of solder interconnects 170. An electrical path between the substrate 102 and the integrated device 109 may include the chiplet 101, the chiplet 103 and at least one solder interconnect from the plurality of solder interconnects 190. An electrical path between the substrate 102 and the integrated device 109 may include the chiplet 101, an encapsulation interconnect from the plurality of encapsulation interconnects 182, and at least one solder interconnect from the plurality of solder interconnects 190.

Figure 6:
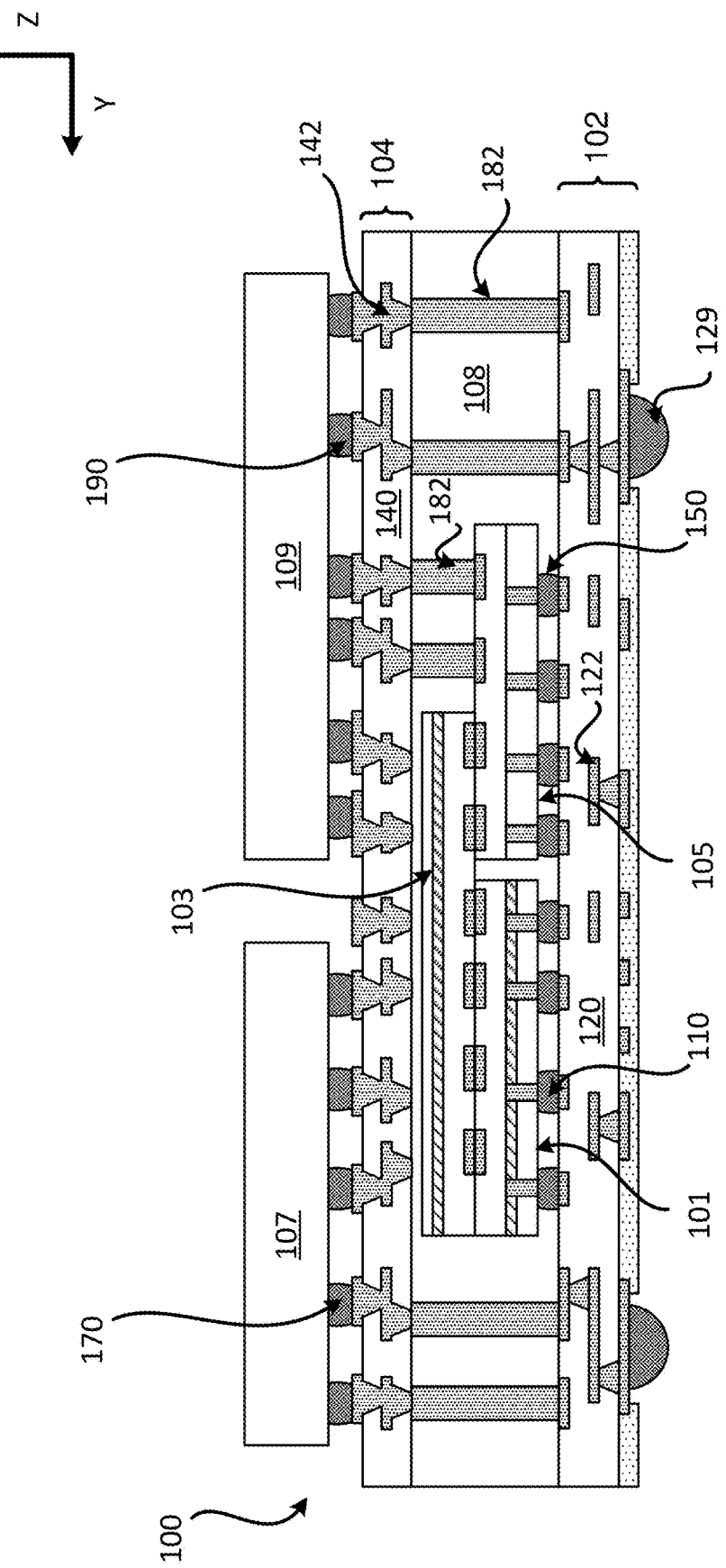
FIG. 6 illustrates a cross sectional profile view of a package comprising an integrated device, a metallization portion and a chiplet.

FIG. 6 illustrates a cross sectional profile view of a package 600 that includes an integrated device and a chiplet. The package 600 is similar to the package 100. The package 600 includes the substrate 102, the metallization portion 104, the integrated device 107, the integrated device 109, the chiplet 101, the chiplet 103, the chiplet 105, the encapsulation layer 108 and the plurality of encapsulation interconnects 182.

The package 600 illustrates that there is no electrical path through the back side of the chiplet 103. Thus, the chiplet 103 may be configured to be electrically coupled to one or more integrated devices (e.g., 107, 109) through an electrical path that includes the chiplet 101, interconnects from the substrate 102, an encapsulation interconnect from the plurality of encapsulation interconnects 182, metallization interconnects from the metallization portion 104, and solder interconnects from the plurality of solder interconnects (e.g., 170, 190). In some implementations, the chiplet 103 may be configured to be electrically coupled to one or more integrated devices (e.g., 107, 109) through an electrical path that includes the chiplet 105, an encapsulation interconnect from the plurality of encapsulation interconnects 182, metallization interconnects from the metallization portion 104, and solder interconnects from the plurality of solder interconnects (e.g., 170, 190).

Figure 7:
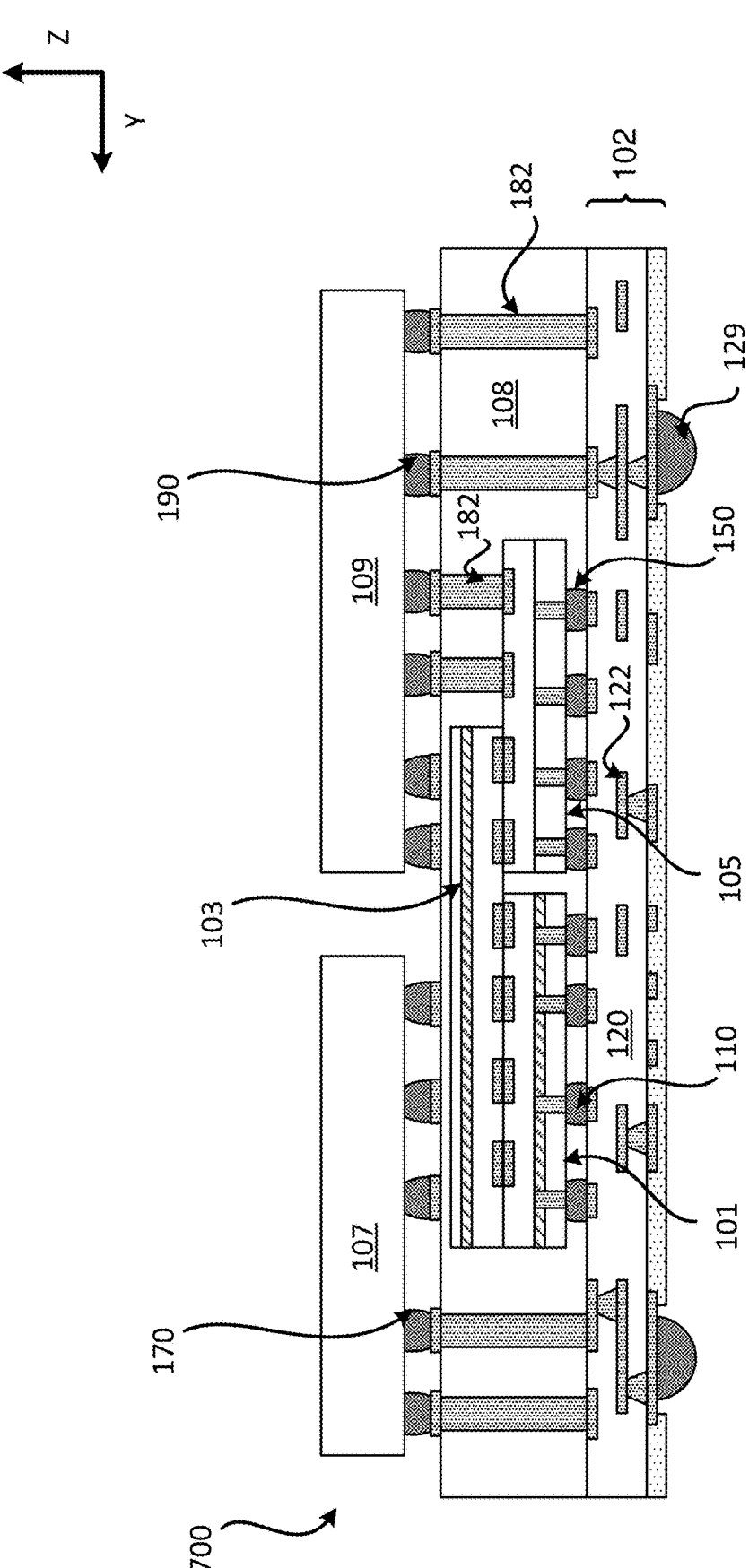
FIG. 7 illustrates a cross sectional profile view of a package comprising an integrated device, a metallization portion and a chiplet.

FIG. 7 illustrates a cross sectional profile view of a package 700 that includes an integrated device and a chiplet. The package 700 is similar to the package 600. However, the package 700 does not include the metallization portion 104. The package 700 includes the substrate 102, the integrated device 107, the integrated device 109, the chiplet 101, the chiplet 103, the chiplet 105, the encapsulation layer 108, the plurality of encapsulation interconnects 182.

The package 700 illustrates that there is no electrical path through the back side of the chiplet 103. Thus, the chiplet 103 may be configured to be electrically coupled to one or more integrated devices (e.g., 107, 109) through an electrical path that includes the chiplet 101, interconnects from the substrate 102, an encapsulation interconnect from the plurality of encapsulation interconnects 182, and solder interconnects from the plurality of solder interconnects (e.g., 170, 190). In some implementations, the chiplet 103 may be configured to be electrically coupled to one or more integrated devices (e.g., 107, 109) through an electrical path that includes the chiplet 105, an encapsulation interconnect from the plurality of encapsulation interconnects 182, and solder interconnects from the plurality of solder interconnects (e.g., 170, 190).

Figure 8:
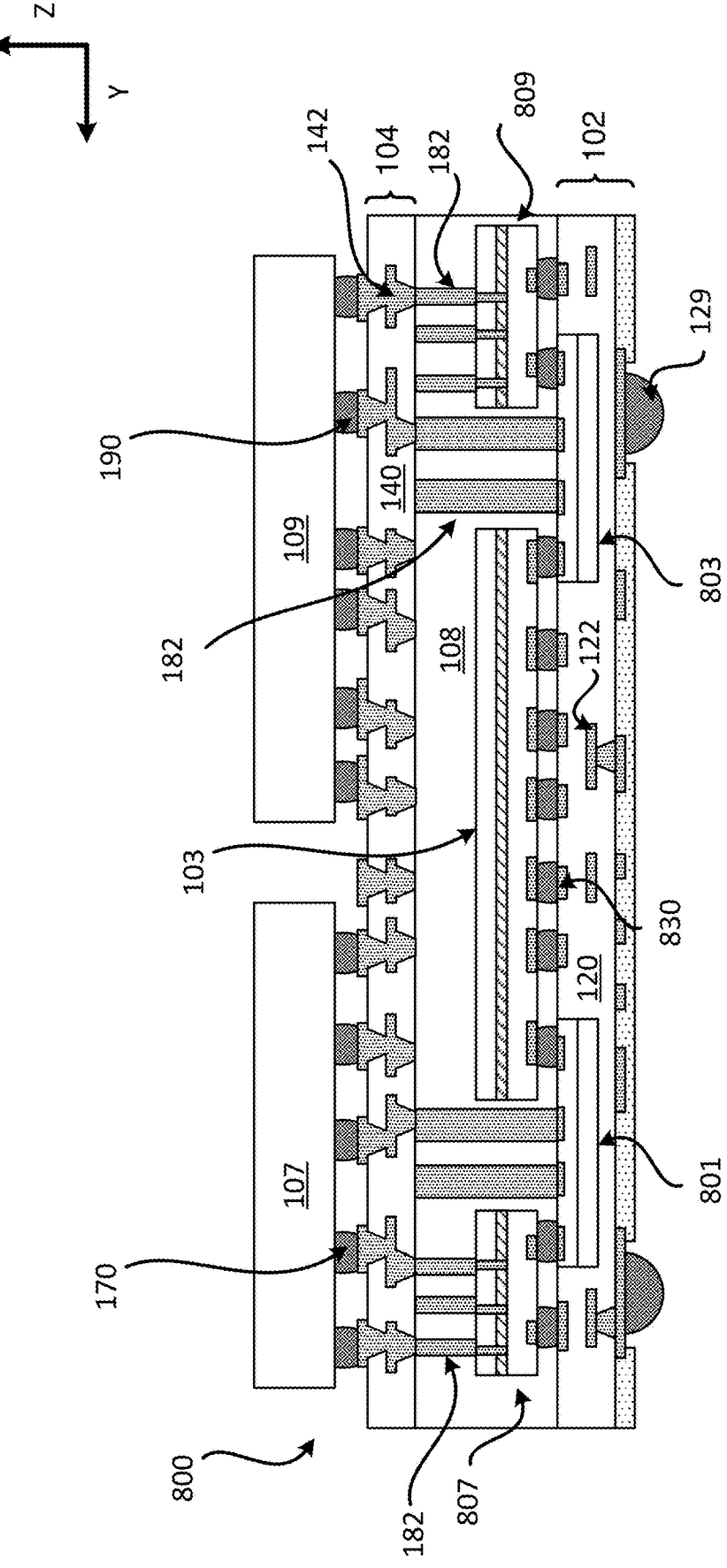
FIG. 8 illustrates a cross sectional profile view of a package comprising an integrated device, a metallization portion and a chiplet.

FIG. 8 illustrates a package 800 that includes the substrate 102, the metallization portion 104, a bridge 801, a bridge 803, a chiplet 103, a chiplet 807, a chiplet 809, the integrated device 107, the integrated device 109, the encapsulation layer 108, and the plurality of encapsulation interconnects 182.

The bridge 801 and the bridge 803 are located in (e.g., embedded in) the substrate 102. The substrate 102 includes at least one dielectric layer 120 and a plurality of interconnects 122. The substrate 102 may include the bridge 801 and the bridge 803.

The chiplet 103, the chiplet 807 and the chiplet 809 are located between the substrate 102 and the metallization portion 104. The chiplet 103 is coupled to the substrate 102 through a plurality of solder interconnects 830, such that the front side of the chiplet 103 faces towards the substrate 102 and the back side of the chiplet 103 faces towards the metallization portion 104. The chiplet 807 is coupled to the substrate 102 through a plurality of solder interconnects 870, such that the front side of the chiplet 807 faces towards the substrate 102 and the back side of the chiplet 807 faces towards the metallization portion 104. The chiplet 809 is coupled to the substrate 102 through a plurality of solder interconnects 890, such that the front side of the chiplet 809 faces towards the substrate 102 and the back side of the chiplet 809 faces towards the metallization portion 104.

The plurality of encapsulation interconnects 182 may be coupled to the substrate 102 and the metallization portion 104. The plurality of encapsulation interconnects 182 may be coupled to the bridge (e.g., 801, 803) of the substrate 102 and the metallization portion 104. The plurality of encapsulation interconnects 182 are coupled to the chiplet 807 and the metallization portion 104. The plurality of encapsulation interconnects 182 are coupled to the chiplet 809 and the metallization portion 104. The metallization portion 104 is coupled to the encapsulation layer 108. The integrated device 107 is coupled to the metallization portion 104 through the plurality of solder interconnects 170. The integrated device 109 is coupled to the metallization portion 104 through the plurality of solder interconnects 190.

The chiplet 103 is configured to be electrically coupled to the chiplet 807 through the bridge 801 such that an electrical path between the chiplet 103 and the chiplet 807 includes a solder interconnect from the plurality of solder interconnects 830, at least one bridge interconnect from the bridge 801, a solder interconnect from the plurality of solder interconnect 870.

The chiplet 103 is configured to be electrically coupled to the chiplet 809 through the bridge 803 such that an electrical path between the chiplet 103 and the chiplet 809 includes a solder interconnect from the plurality of solder interconnects 810, at least one bridge interconnect from the bridge 803, a solder interconnect from the plurality of solder interconnect 890.

The chiplet 103 is configured to be electrically coupled to the integrated device 107 such that an electrical path between the chiplet 103 and the integrated device 107 includes a solder interconnect from the plurality of solder interconnects 830, at least one bridge interconnect from the bridge 801, at least one encapsulation interconnect from the plurality of encapsulation interconnects 182, at least one metallization interconnect from the plurality of metallization interconnects 142, and a solder interconnect from the plurality of solder interconnect 170.

The chiplet 103 is configured to be electrically coupled to the integrated device 109 such that an electrical path between the chiplet 103 and the integrated device 109 includes a solder interconnect from the plurality of solder interconnects 830, at least one bridge interconnect from the bridge 803, at least one encapsulation interconnect from the plurality of encapsulation interconnects 182, at least one metallization interconnect from the plurality of metallization interconnects 142, and a solder interconnect from the plurality of solder interconnect 190.

The chiplet 807 is configured to be electrically coupled to the integrated device 107 such that an electrical path between the chiplet 807 and the integrated device 107 includes at least one encapsulation interconnect from the plurality of encapsulation interconnects 182, at least one metallization interconnect from the plurality of metallization interconnects 142, and a solder interconnect from the plurality of solder interconnect 170.

The chiplet 809 is configured to be electrically coupled to the integrated device 109 such that an electrical path between the chiplet 809 and the integrated device 109 includes at least one encapsulation interconnect from the plurality of encapsulation interconnects 182, at least one metallization interconnect from the plurality of metallization interconnects 142, and a solder interconnect from the plurality of solder interconnect 190.

Figure 9:
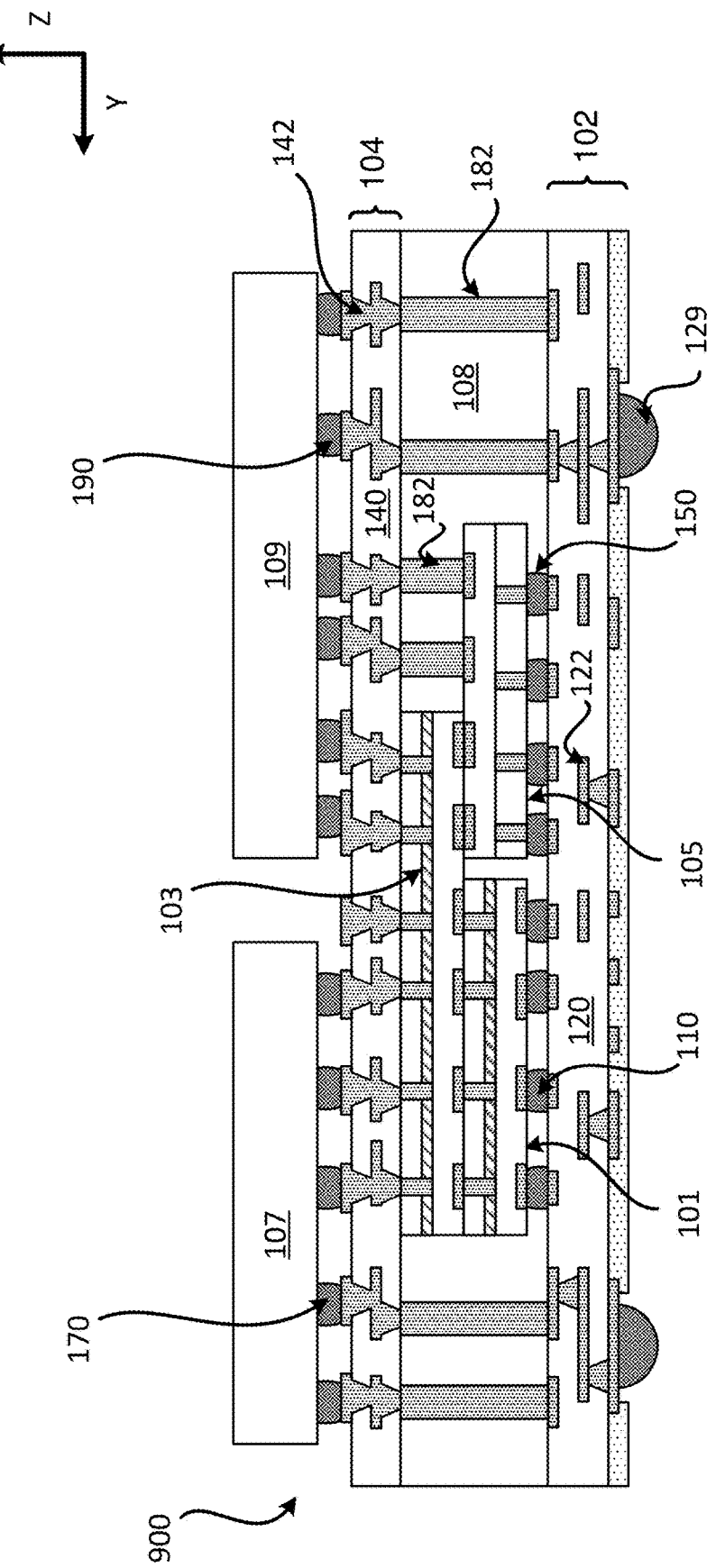
FIG. 9 illustrates a cross sectional profile view of a package comprising an integrated device, a metallization portion and a chiplet.

FIG. 9 illustrates a package 900 that includes a substrate 102, a metallization portion 104, an integrated device 107, an integrated device 109, a chiplet 101, a chiplet 103, a chiplet 105, an encapsulation layer 108, a plurality of encapsulation interconnects 182. The chiplet 101, the chiplet 103 and the chiplet 105 are located between the substrate 102 and the metallization portion 104. The back side of the chiplet 103 is coupled to the metallization portion 104. The front side of the chiplet 103 is coupled to the back side of the chiplet 101. The chiplet 101 is coupled to the substrate 102 through the plurality of solder interconnects 110, such that the front side of the chiplet 101 faces towards the substrate 102.

The chiplet 105 is coupled to the substrate 102 through the plurality of solder interconnects 150, such that the back side of the chiplet 105 faces towards the substrate 102. The front side of the chiplet 105 faces the metallization portion 104. The front side of the chiplet 105 is coupled to the front side of the chiplet 103.

Figure 10:
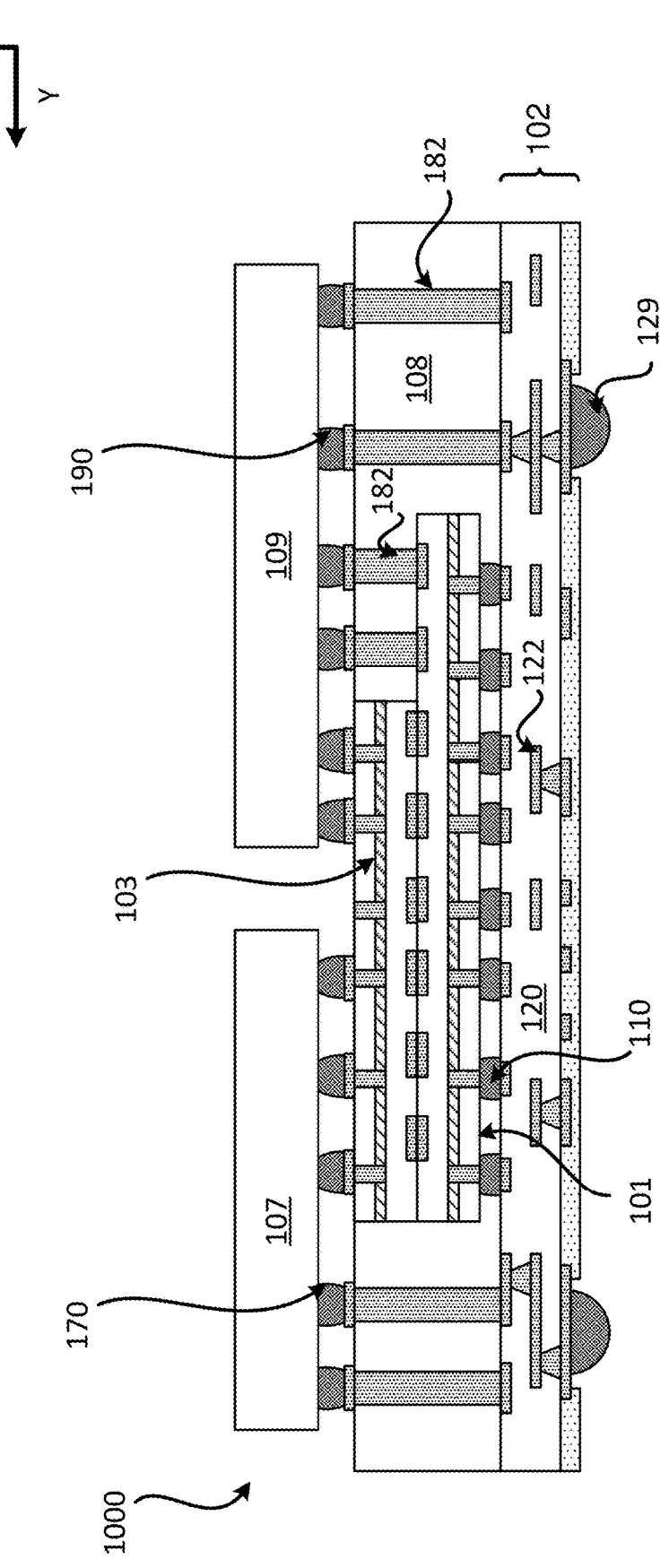
FIG. 10 illustrates a cross sectional profile view of a package comprising an integrated device, a metallization portion and a chiplet.

FIG. 10 illustrates a package 1000 that includes a substrate 102, an integrated device 107, an integrated device 109, a chiplet 101, a chiplet 103, an encapsulation layer 108, a plurality of encapsulation interconnects 182. The chiplet 103 is coupled to the integrated device 107 and the integrated device 109 such that back side of the chiplet 103 faces towards the integrated device 107 and the integrated device 109. The front side of the chiplet 103 is coupled to the front side of the chiplet 101. The back side of the chiplet 101 is coupled to the substrate 102 through a plurality of solder interconnects 110.

Figure 11:
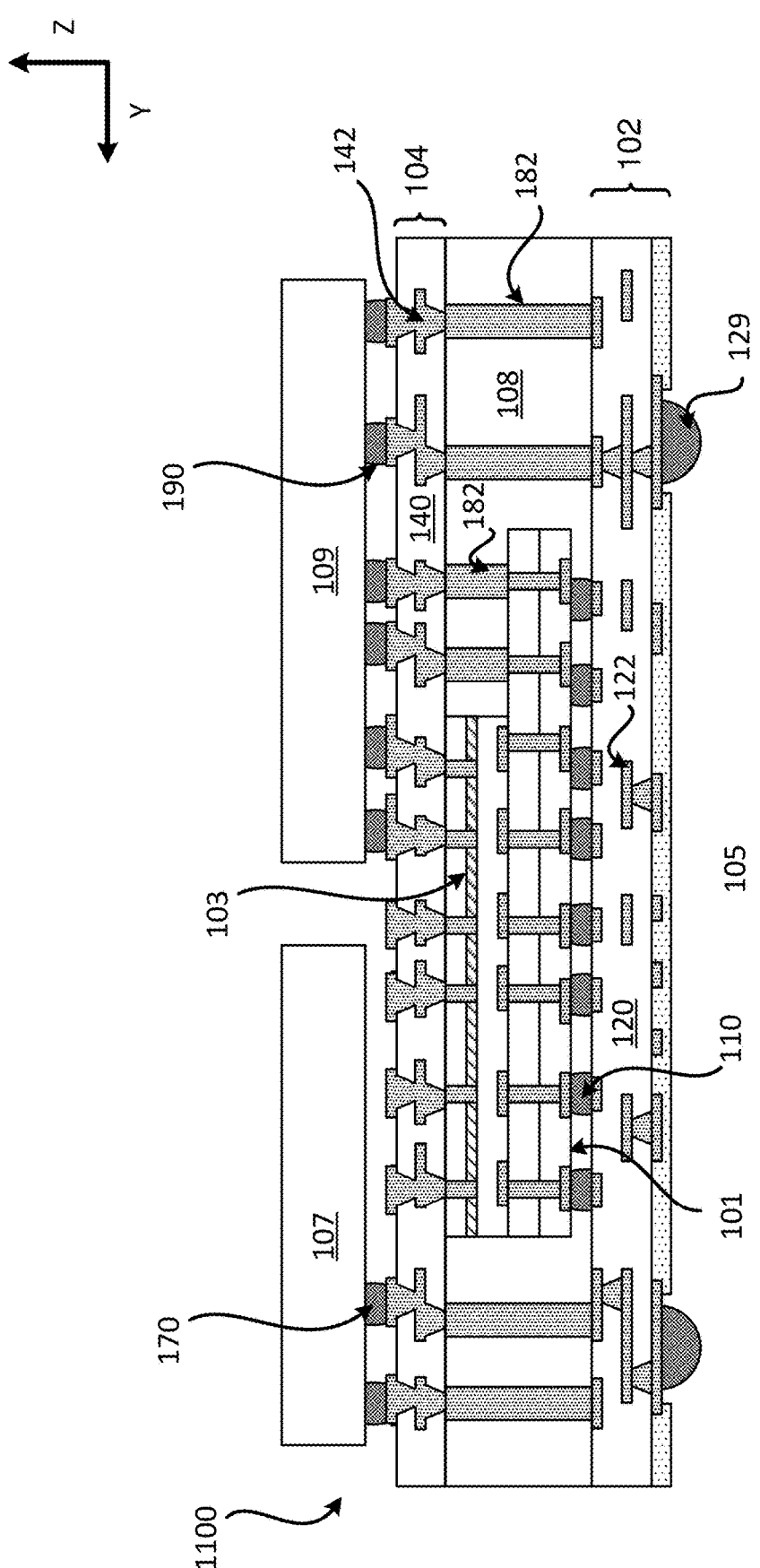
FIG. 11 illustrates a cross sectional profile view of a package comprising an integrated device, a metallization portion and a chiplet.

FIG. 11 illustrates a package 1100 that includes a substrate 102, a metallization portion 104, an integrated device 107, an integrated device 109, a chiplet 101, a chiplet 103, an encapsulation layer 108, a plurality of encapsulation interconnects 182. The chiplet 101 and the chiplet 103 are located between the substrate 102 and the metallization portion 104. The chiplet 103 is coupled to the metallization portion 104 such that the back side of the chiplet 103 faces the metallization portion 104. The front side of the chiplet 103 is coupled to the back side of the chiplet 101. The back side of the chiplet 101 is coupled to the substrate 102 through the plurality of solder interconnects 110.

Figure 12:
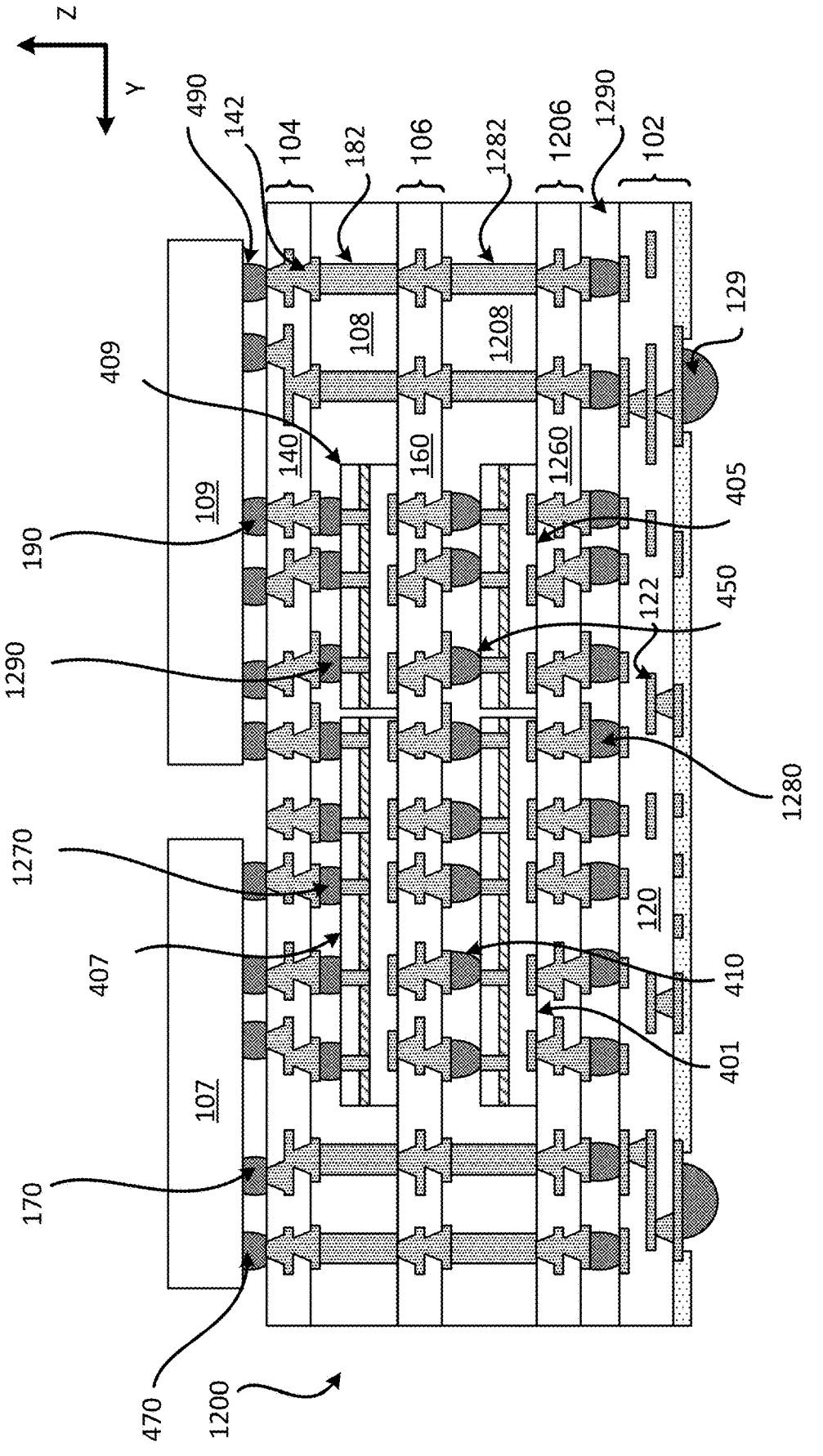
FIG. 12 illustrates a cross sectional profile view of a package comprising an integrated device, a metallization portion and a chiplet.

FIG. 12 illustrates a package 1200 that includes a substrate 102, a metallization portion 104, a metallization portion 106, a metallization portion 1206, a chiplet 401, a chiplet 405, a chiplet 407, a chiplet 409, an encapsulation layer 108, an encapsulation layer 1208, an encapsulation layer 1290, a plurality of encapsulation interconnects 182, a plurality of encapsulation interconnects 1282.

The integrated device 107 is coupled to the metallization portion 104 through a plurality of solder interconnects 170. The integrated device 109 is coupled to the metallization portion 104 through a plurality of solder interconnects 190. The chiplet 407 and the chiplet 409 are located between the metallization portion 104 and the metallization portion 106. The back side of the chiplet 407 is coupled to the metallization portion 104 through a plurality of solder interconnects 1270. The front side of the chiplet 407 is coupled to the metallization portion 106. The back side of the chiplet 409 is coupled to the metallization portion 104 through a plurality of solder interconnects 129. The front side of the chiplet 409 is coupled to the metallization portion 106.

The chiplet 401 and the chiplet 405 are located between the metallization portion 1206 and the metallization portion 106. The back side of the chiplet 401 is coupled to the metallization portion 106 through a plurality of solder interconnects 410. The front side of the chiplet 401 is coupled to the metallization portion 1206. The back side of the chiplet 405 is coupled to the metallization portion 106 through a plurality of solder interconnects 450. The front side of the chiplet 405 is coupled to the metallization portion 1206. The metallization portion 1206 is coupled to the substrate 102 through a plurality of solder interconnects 1280. The encapsulation layer 1290 is located between the metallization portion 1206 and the substrate 102.

It is noted that components of a package may be electrically coupled to one another through several electrical paths in the package. An electrical path between two components may include any electrical path described above and/or any interconnect that is coupled directly or indirectly to another interconnect. The electrical paths that are described in the disclosure are exemplary. Thus, an electrical path may be possible between two interconnects (e.g., metallization interconnect, pillar interconnect, solder interconnect, encapsulation interconnect) that are shown in the figures of the disclosure to be touching each other. Different implementations may use different electrical paths.

Exemplary Chiplet with Trench Capacitors

Figure 13:
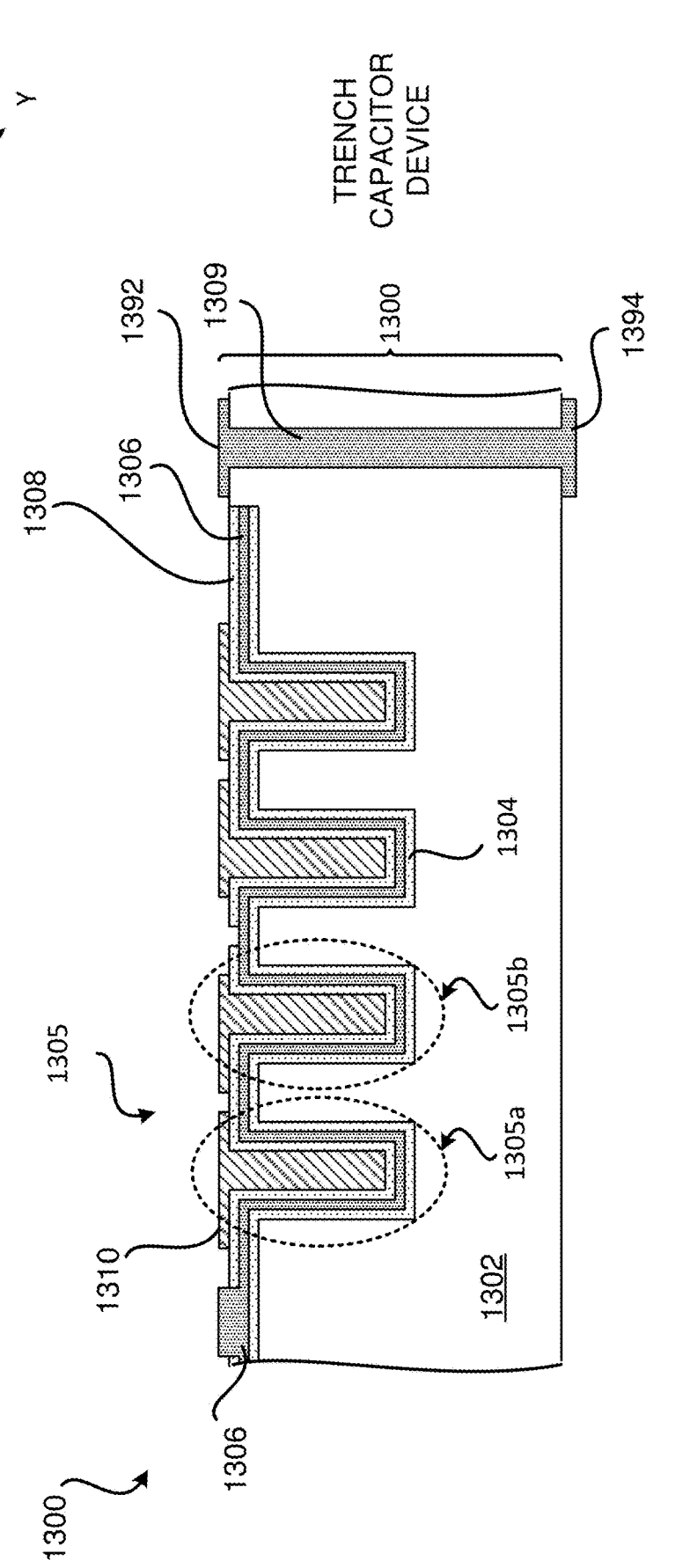
FIG. 13 illustrates a cross sectional profile view of a deep trench capacitor.

In some implementations, a chiplet may include a deep trench capacitor. FIG. 13 illustrates a cross sectional profile view of a chiplet 1300 that configured as a trench capacitor device. The chiplet 1300 may be an integrated passive device that includes multiple trench capacitors (e.g., deep trench capacitors). The chiplet 1300 may be a means for trench capacitance. The chiplet 1300 may represent any of the chiplets described in the disclosure. Thus, some of structures of the chiplets described in the disclosure may be different from structure of the chiplet 103 described in FIG. 1. The chiplet 1300 may replace any of the chiplets described in the disclosure. The chiplet 1300 includes a front side and a back side. The front side of the chiplet 1300 may include the plurality of trench capacitors.

The chiplet 1300 includes a chiplet substrate 1302 and a plurality of trench capacitors 1305. A plurality of solder interconnects (not shown) may be coupled to the chiplet 1300. The chiplet substrate 1302 may include silicon (Si). The chiplet substrate 1302 may include a plurality of trenches and/or cavities over which capacitors may be formed.

The plurality of trench capacitors 1305 includes a trench capacitor 1305a and a trench capacitor 1305b. The trench capacitor 1305a and the trench capacitor 1305b may be configured to be part of a same capacitor (e.g., first capacitor, first trench capacitor). The trench capacitor 1305a and the trench capacitor 1305b may be configured to be coupled to and/or part of a first power distribution network (PDN). The trench capacitor 1305a and the trench capacitor 1305b may be configured to be part of a first electrical path for a first power for a package. The trench capacitor 1305a and the trench capacitor 1305h may be configured to be coupled to integrated device(s).

As shown in FIG. 13, the chiplet 1300 includes the chiplet substrate 1302, an oxide layer 1304, a first electrically conductive layer 1306, a dielectric layer 1308, and a second electrically conductive layer 1310. The first electrically conductive layer 1306 and/or the second electrically conductive layer 1310 may include polysilicon. The oxide layer 1304 and/or the dielectric layer 1308 may include $SiO_2$ (e.g., low-pressure chemical vapor deposition (LPCVD) $SiO_2$) or $Si_3N_4$ (e.g., LPCVD $Si_3N_4$. Portions of the oxide layer 1304, the first electrically conductive layer 1306, the dielectric layer 1308, and the second electrically conductive layer 1310 may be located in trenches and/or cavities of the chiplet substrate 1302. It is noted that a chiplet substrate 1302 may be considered to have a trench or a cavity, even if the trench or the cavity is filled with one or more materials.

The trench capacitor 1305a (e.g., first trench capacitor, first capacitor, means for first trench capacitance) may be defined by (i) a first portion of the oxide layer 1304, (ii) a first portion of the first electrically conductive layer 1306, (iii) a first portion of the dielectric layer 1308, and (iv) a first portion of the second electrically conductive layer 1310 that are located in a trench (e.g., first trench) of the chiplet substrate 1302.

The trench capacitor 1305b (e.g., second trench capacitor, second capacitor, means for second trench capacitance) may be defined by (i) a second portion of the oxide layer 1304. (ii) a second portion of the first electrically conductive layer 1306. (iii) a second portion of the dielectric layer 1308, and (iv) a second portion of the second electrically conductive layer 1310 that are located in a trench (e.g., second trench) of the chiplet substrate 1302. It is noted that trench capacitor 1305b may be part of a same capacitor as the trench capacitor 1305a. That is, the trench capacitor 1305a and the trench capacitor 1305b may be configured to be electrically coupled together to form a capacitor (e.g., first capacitor) with a greater capacitance.

The chiplet 1300 also includes an interconnect 1309, an interconnect 1392 and an interconnect 1394. The interconnect 1309 is coupled to the interconnect 1392 and the interconnect 1394. The interconnect 1309 may be a through substrate via that extends through the chiplet substrate 1302. The interconnect 1392 may be a pad interconnect. The interconnect 1394 may be a pad interconnect. The interconnect 1392 may be located on the front side of the chiplet 1300. The interconnect 1392 may be located on the back side of the chiplet 1300. The interconnect 1309 may be a through chiplet substrate interconnect. The chiplet may include at least one through chiplet substrate interconnect.

An integrated device (e.g., 107, 109) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 107, 109) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets (e.g., 101, 103) and/or one of more of integrated devices (e.g., 107, 109) described in the disclosure may be fabricated using the same technology node or two or more different technology nodes. For example, an integrated device (e.g., 107) may be fabricated using a first technology node, and a chiplet (e.g., 103) may be fabricated using a second technology node that is not as advanced as the first technology node. In such an example, the integrated device (e.g., 107) may include components (e.g., interconnects, transistors) that have a first minimum size, and the chiplet (e.g., 103) may include components (e.g., interconnects, transistors) that have a second minimum size, where the second minimum size is greater than the first minimum size. In some implementations, the integrated device 107 and the integrated device 109 of a package, may be fabricated using the same technology node or different technology nodes. In some implementations, a chiplet (e.g., 103) and another chiplet (e.g., 105) of a package, may be fabricated using the same technology node or different technology nodes.

As an example, in some implementations, a first integrated device (e.g., 107) may include a first plurality of die interconnects comprising a first minimum spacing, and a second integrated device (e.g., 109) may include a second plurality of die interconnects comprising a second minimum spacing. A chiplet (e.g., 101, 103, 105) may include a plurality of interconnects comprising a third minimum spacing. In some implementations, the third minimum spacing may be different than the first minimum spacing and/or the second minimum spacing. In another example, in some implementations, an integrated device (e.g., 107, 109) may include a plurality of die interconnects comprising a first minimum spacing, and a chiplet (e.g., 101, 103, 105) may include a plurality of interconnects comprising a second minimum spacing. In yet another example, in some implementations, an integrated device (e.g., 107, 109) may include a first plurality of transistors comprising a first minimum spacing, and a chiplet (e.g., 101, 103, 105) may include a second plurality of transistors comprising a second minimum spacing. In some implementations, the first minimum spacing may be less than the second minimum spacing. In some implementations, the first minimum spacing may be the same as the second minimum spacing.

The metallization portion 104 includes at least one dielectric layer 140 and a plurality of metallization interconnects 142. The metallization portion 104 may include a redistribution portion. The plurality of metallization interconnects 142 may include a plurality of redistribution interconnects. The metallization portion 104 may be a means for metallization interconnection. The plurality of metallization interconnects 142 may be coupled to a back side of a chiplet and/or a front side of a chiplet.

The metallization portion 106 includes at least one dielectric layer 160 and a plurality of metallization interconnects 162. The metallization portion 106 may include a redistribution portion. The plurality of metallization interconnects 162 may include a plurality of redistribution interconnects. The metallization portion 106 may be a means for metallization interconnection. The plurality of metallization interconnects 162 may be coupled to a back side of a chiplet and/or a front side of a chiplet.

The metallization portion 1206 includes at least one dielectric layer 1260 and a plurality of metallization interconnects 1262. The metallization portion 1206 may include a redistribution portion. The plurality of metallization interconnects 1262 may include a plurality of redistribution interconnects. The metallization portion 1206 may be a means for metallization interconnection. The plurality of metallization interconnects 1262 may be coupled to a back side of a chiplet and/or a front side of a chiplet.

A metallization portion (e.g., 104, 106, 1206) may include a redistribution portion that includes redistribution interconnects (e.g., redistribution layer (RDL) interconnects). A redistribution interconnect may include portions that have a U-shape or V-shape. The terms "U-shape" and "V-shape" shall be interchangeable. The terms "U-shape" and "V-shape" may refer to the side profile shape of the interconnects and/or redistribution interconnects. The U-shape interconnect (e.g., U-shape side profile interconnect) and the V-shape interconnect (e.g., V-shape side profile interconnect) may have a top portion and a bottom portion. A bottom portion of a U-shape interconnect (or a V-shape interconnect) may be coupled to a top portion of another U-shape interconnect (or a V-shape interconnect).

An encapsulation layer (e.g., 108, 208, 408) may include a mold, a resin and/or an epoxy. The encapsulation layer may be a means for encapsulation. The encapsulation layer may be provided by using a compression and transfer molding process, a sheet molding process, or a liquid molding process.

The location and/or placement of a chiplet near an integrated device helps reduce signal and/or current latency between the integrated device and the chiplet, which helps improve the performance of the integrated device and/or the package. The chiplet may be configured as a deep trench capacitor. However, different implementations may use a chiplet that is configured to perform other operations and/or functionalities.

The use of the integrated device, the chiplet and the metallization portion in the package of FIG. 1, as well as in the packages described in at least FIGS. 1-12 provides several advantages. One, redistributing various functions of the package across at least one integrated device and at least one chiplet can lead to cost savings for the package. Integrated devices and chiplets can be fabricated using different technology nodes, which may have different costs.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Moreover, the chiplet can be coupled to the integrated device through copper to copper hybrid bond or through solder interconnects, such that the chiplet is very close to the integrated device. For example, the chiplet and the integrated device can be implemented with a metallization portion (e.g., redistribution portion) to position the chiplet to be as close to the integrated device as possible, which reduces the electrical path between the chiplet and the integrated device. This helps improve the performance of the integrated device and the power that is provided to the integrated device.

In addition, a chiplet that include trench capacitors provides several technical benefits. A trench capacitor and/or a trench capacitor device provides a capacitor with high capacitance and/or high capacitance density. Capacitors with higher capacitance density allow for more compact form factors for the package, since these capacitors take up less space but can provide capacitance that are the same and/or comparable to larger sized capacitors. The compact form factor of the trench capacitors allows them to be located very closely to an integrated device, which can help improve power delivery performance to an integrated device. Moreover, since these trench capacitors have small form factors, they can be implemented with a metallization portion instead of being implemented in a package substrate. Thus, the high capacitance capacitors may be implemented during the fabrication of the package, instead of being implemented when the package is coupled to a substrate.

High capacitance capacitors are especially important in certain types of processing operations, such as compute applications (e.g., high performance processing). The use of the chiplet, the integrated device and the metallization portion, as described in the disclosure, helps improve die to die communication, which helps improve the overall performance of the integrated device(s) and the package.

A bridge (e.g., 801, 803) may include a die substrate (e.g., bridge substrate) and a plurality of bridge interconnects. The bridge may include a dielectric layer (e.g., bridge dielectric layer). The bridge dielectric layer may be formed over the bridge substrate and the plurality of bridge interconnects.

FIGS. 1-12 illustrate various packages that include at least one chiplet that is located near an integrated device. The use of the chiplets and integrated devices with metallization portion(s) provides several advantages. One, a chiplet can be fabricated using a different fabrication process (e.g., technology node) than an integrated device. This helps with cost savings since a chiplet may not need to be fabricated using the most expensive fabrication process. Moreover, the use of chiplets with metallization portion(s) helps improve electrical performance between integrated devices and/or chiplets, as the chiplets and/or the integrated devices can be located close to each other.

As mentioned above, a package may include several metallization portions. Any of the metallization portions may be a first metallization portion, and/or any of the metallization portions may be a second metallization portion. For example, in some implementations, the metallization portion 104 may be considered a first metallization portion, and the metallization portion 106 may be considered a second metallization portion. In some implementations, the metallization portion 106 may be considered a first metallization portion, and the metallization portion 104 may be considered a second metallization portion.

As mentioned above, a chiplet may include a trench capacitor and/or be configured to operate as a trench capacitor device. A trench capacitor and/or a trench capacitor device provides a capacitor with high capacitance and/or high capacitance density. Capacitors with higher capacitance density allow for more compact form factors for the package, since these capacitors take up less space but can provide capacitance that are the same and/or comparable to larger sized capacitors. The compact form factor of the trench capacitors allows them to be located very closely to an integrated device, which can help improve power delivery performance to an integrated device. Moreover, since these trench capacitors have small form factors, they can be implemented with a metallization portion instead of being implemented in a package substrate.

Figure 14A:
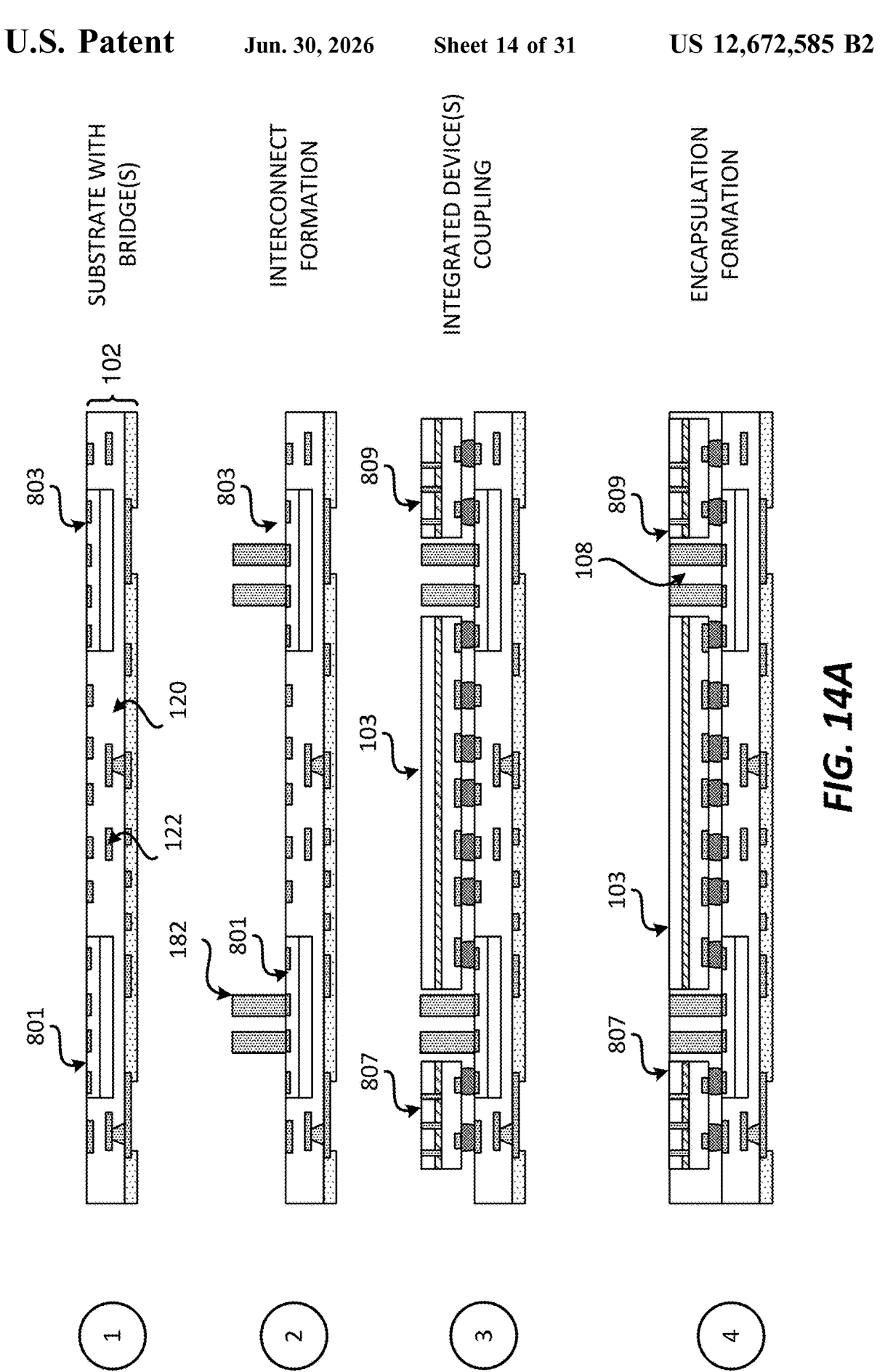
FIGS. 14A-14C illustrate an exemplary sequence for fabricating a package comprising multiple integrated devices, and a metallization portion.
Figure 14B:
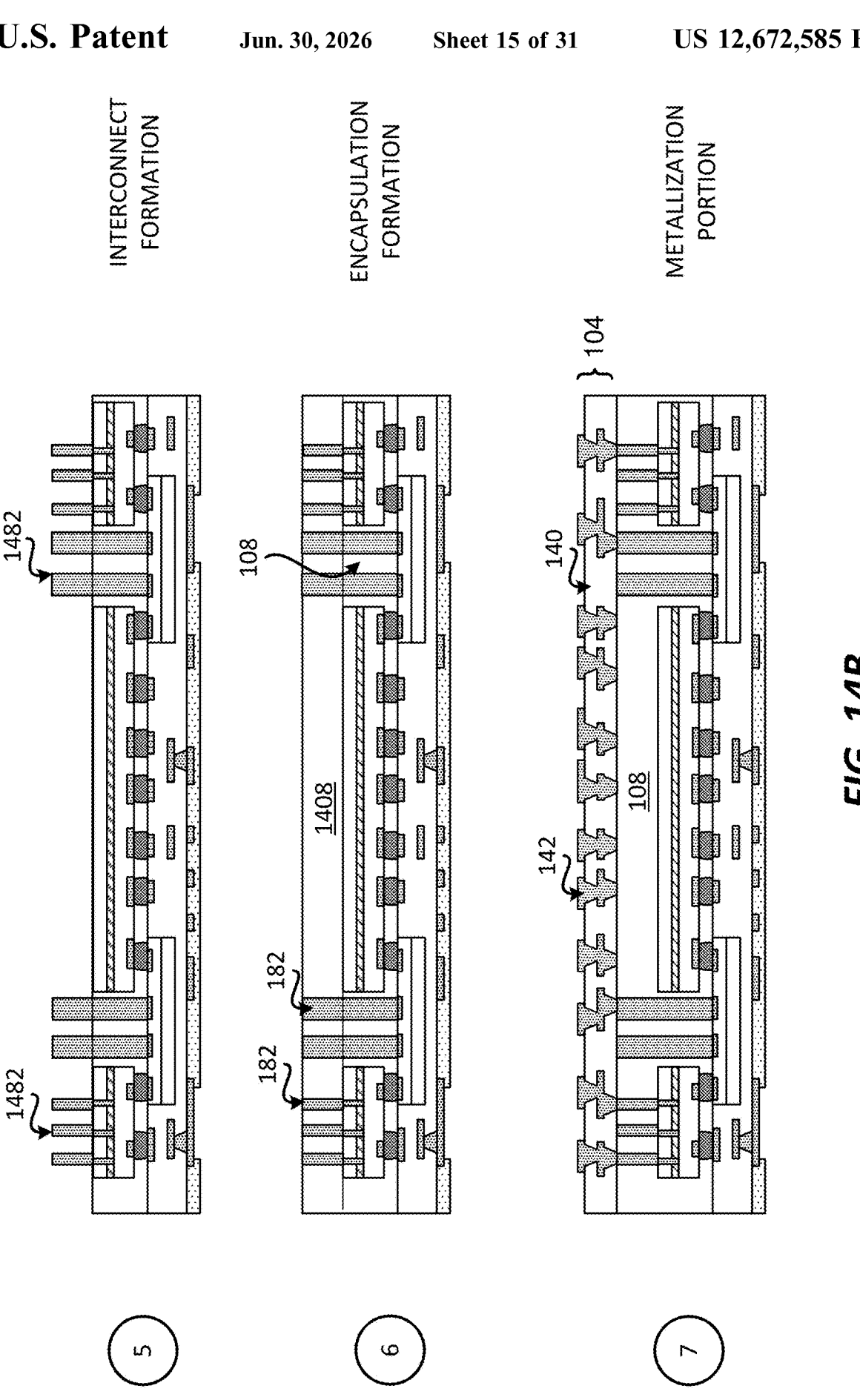
Figure 14C:
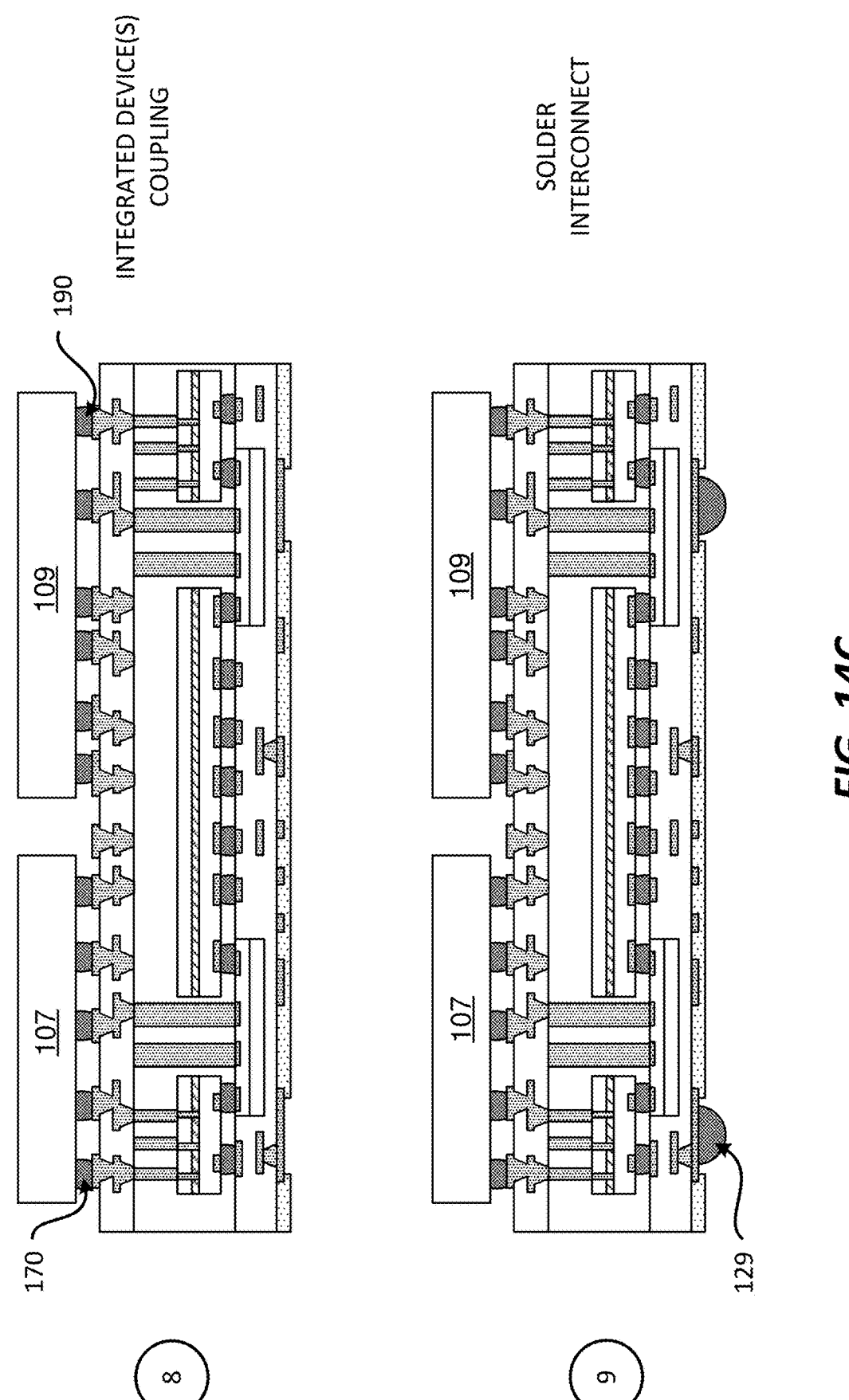

Exemplary Sequence for Fabricating a Package Comprising an Integrated Device and a Chiplet FIGS. 14A-14C illustrate an exemplary sequence for providing or fabricating a package that includes an integrated device and a chiplet. In some implementations, the sequence of FIGS. 14A-14C may be used to provide or fabricate the package 800 of FIG. 8, or any of the packages described in the disclosure.

It should be noted that the sequence of FIGS. 14A-14C may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 14A-14C may be used to fabricate one package or several packages at a time (as part of a wafer).

Stage 1, as shown in FIG. 14A, illustrates a state after a substrate 102 is provided. The substrate 102 includes at least one dielectric layer 120 and a plurality of interconnects. The substrate 102 also include a bridge 801 and a bridge 803. The bridge 801 and the bridge 803 are embedded in the substrate 102. The substrate 102 may also include a solder resist layer.

Stage 2 illustrates a state after a plurality of encapsulation interconnects 182 are formed and coupled to the substrate 102. A masking and plating process may be used to form the plurality of interconnects 182. The plurality of encapsulation interconnects 182 are coupled to the bridge 801 and the bridge 803. For example, the plurality of encapsulation interconnects 182 are coupled to the bridge interconnects of the bridge 801 and the bridge interconnects of the bridge 803. In some implementations, the plurality of encapsulation interconnects 182 are coupled to the plurality of interconnects 122 of the substrate 102.

Stage 3 illustrates a state after a plurality of chiplets are coupled to the substrate 102. For example, the chiplet 103 is coupled to the substrate 102 through a plurality of solder interconnects 830. The chiplet 807 is coupled to the substrate 102 through a plurality of solder interconnects 870. The chiplet 809 is coupled to the substrate 102 through a plurality of solder interconnects 890. A pick and place process may be used to couple the chiplets to the substrate.

Stage 4 illustrates a state after an encapsulation layer 108 is formed and coupled to the substrate 102. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 may be overmolded and then portions of the encapsulation layer 108 may be removed.

Stage 5, as shown in FIG. 14B, illustrates a state after a plurality of encapsulation interconnects 1482 are formed and coupled to the chiplet 807, the chiplet 809 and the plurality of encapsulation interconnects 182. A masking and plating process may be used to form the plurality of encapsulation interconnects 1482.

Stage 6 illustrates a state after an encapsulation layer 1408 is formed and coupled to the encapsulation layer 108. The encapsulation layer 1408 may include a mold, a resin and/or an epoxy. The encapsulation layer 1408 may be a means for encapsulation. The encapsulation layer 1408 may be provided by using a compression and transfer molding process, a sheet molding process, or a liquid molding process. In some implementations, the encapsulation layer 1408 may be overmolded and then portions of the encapsulation layer 1408 may be removed.

Stage 7 illustrates a state after the metallization portion 104 is formed and coupled to the encapsulation layer 108. The encapsulation layer 108 may represent the encapsulation layer 108 and the encapsulation layer 1408. The metallization portion 104 includes at least one dielectric layer 140 and a plurality of metallization interconnects 142. The plurality of metallization portion may be coupled to the plurality of encapsulation interconnects 182. The plurality of encapsulation interconnects 182 may represent the plurality of encapsulation interconnects 182 and/or the plurality of encapsulation interconnects 1482.

Stage 8, as shown in FIG. 14C, illustrates a state after the integrated device 107 is coupled to the metallization portion 104 through a plurality of solder interconnects 170. Stage 8 also illustrates a state after the integrated device 109 is coupled to the metallization portion 104 through a plurality of solder interconnects 190. A solder reflow process may be used to couple the integrated devices to the metallization portion 104.

Stage 9 illustrates a state after a plurality of solder interconnects 129 are coupled to the substrate 102. A solder reflow process may be used to couple the plurality of solder interconnects 129 to the plurality of interconnects 122 of the substrate 102.

Figure 15A:
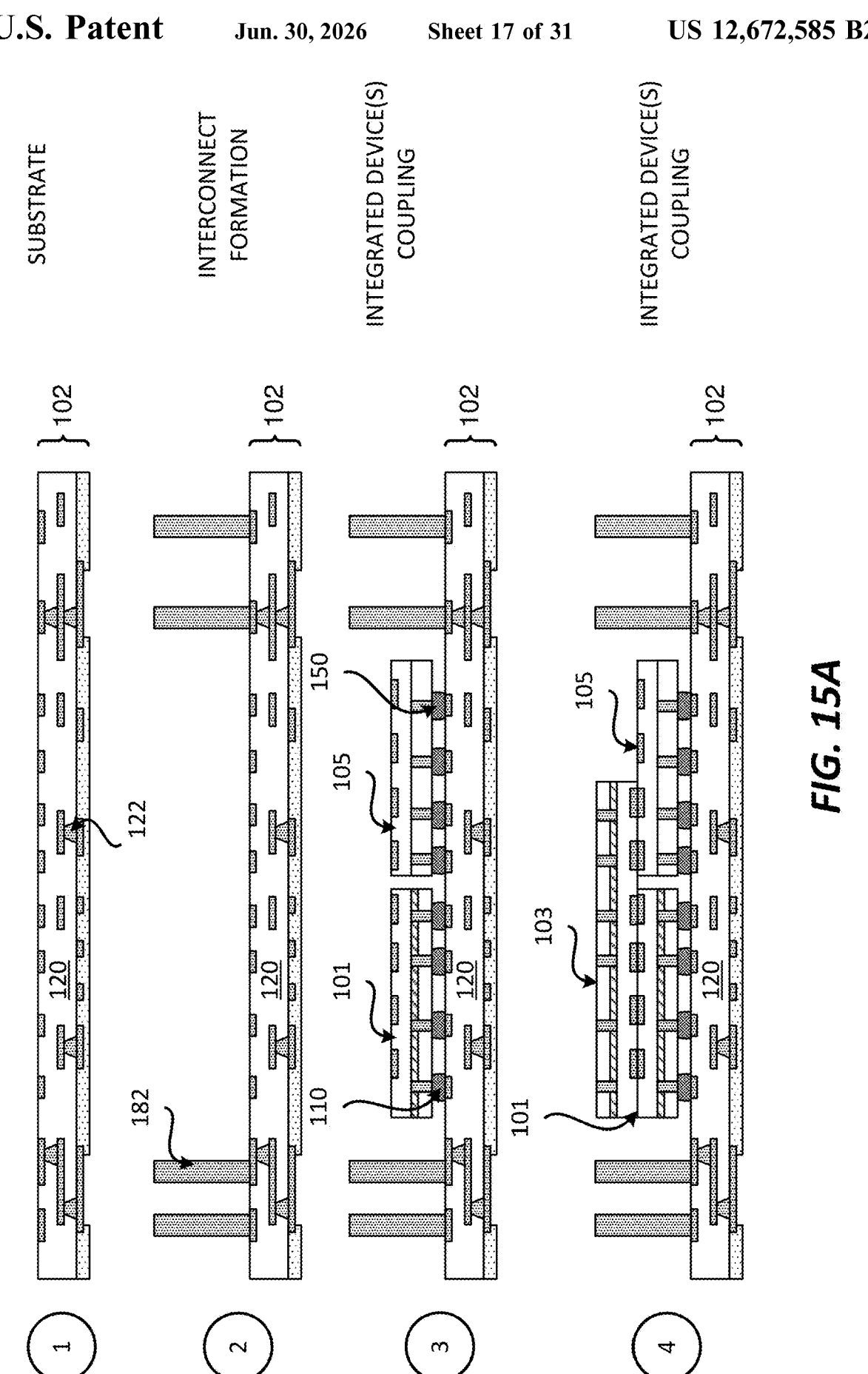
FIGS. 15A-15C illustrate an exemplary sequence for fabricating a package comprising multiple integrated devices, and a metallization portion.
Figure 15B:
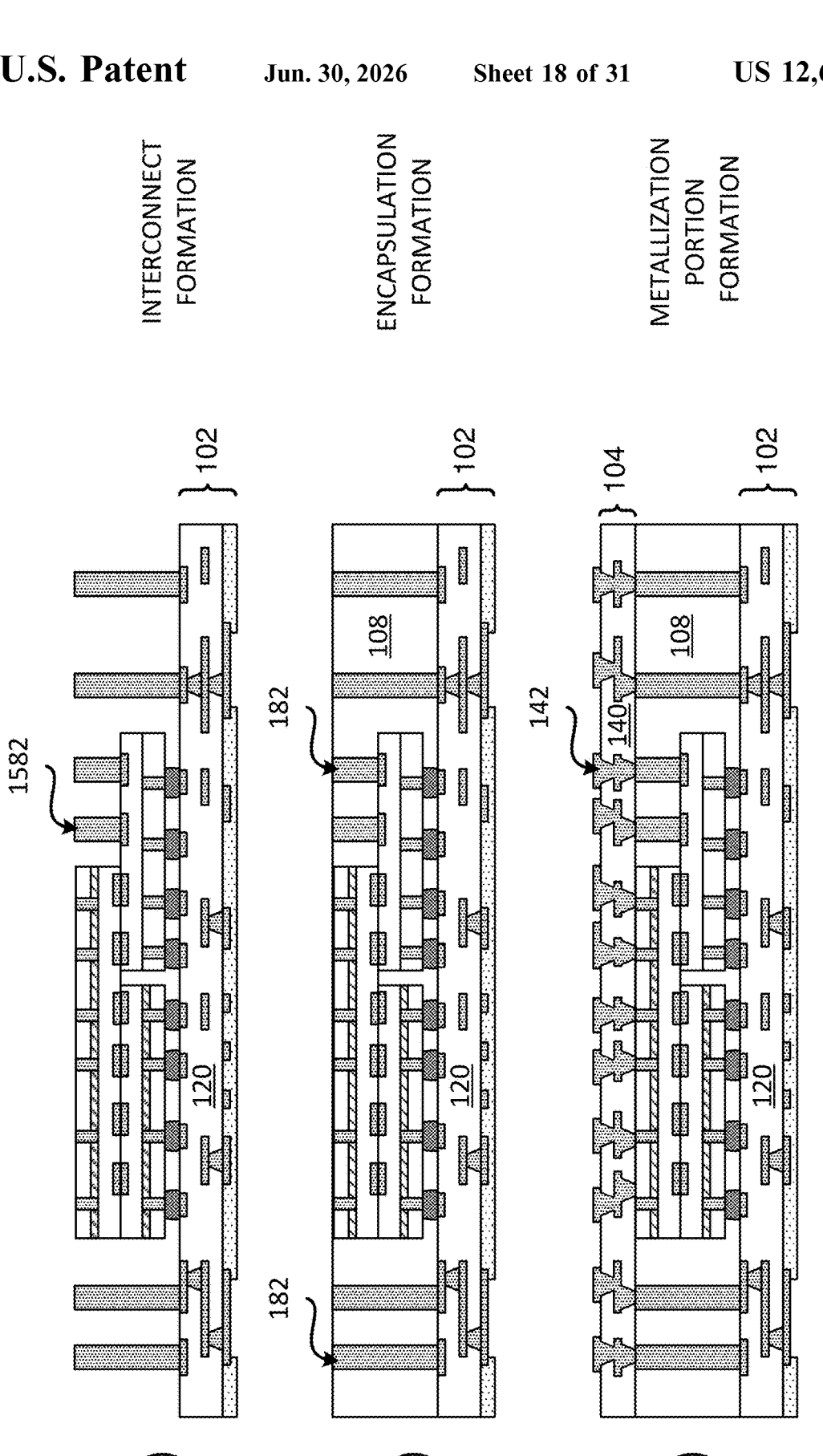
Figure 15C:
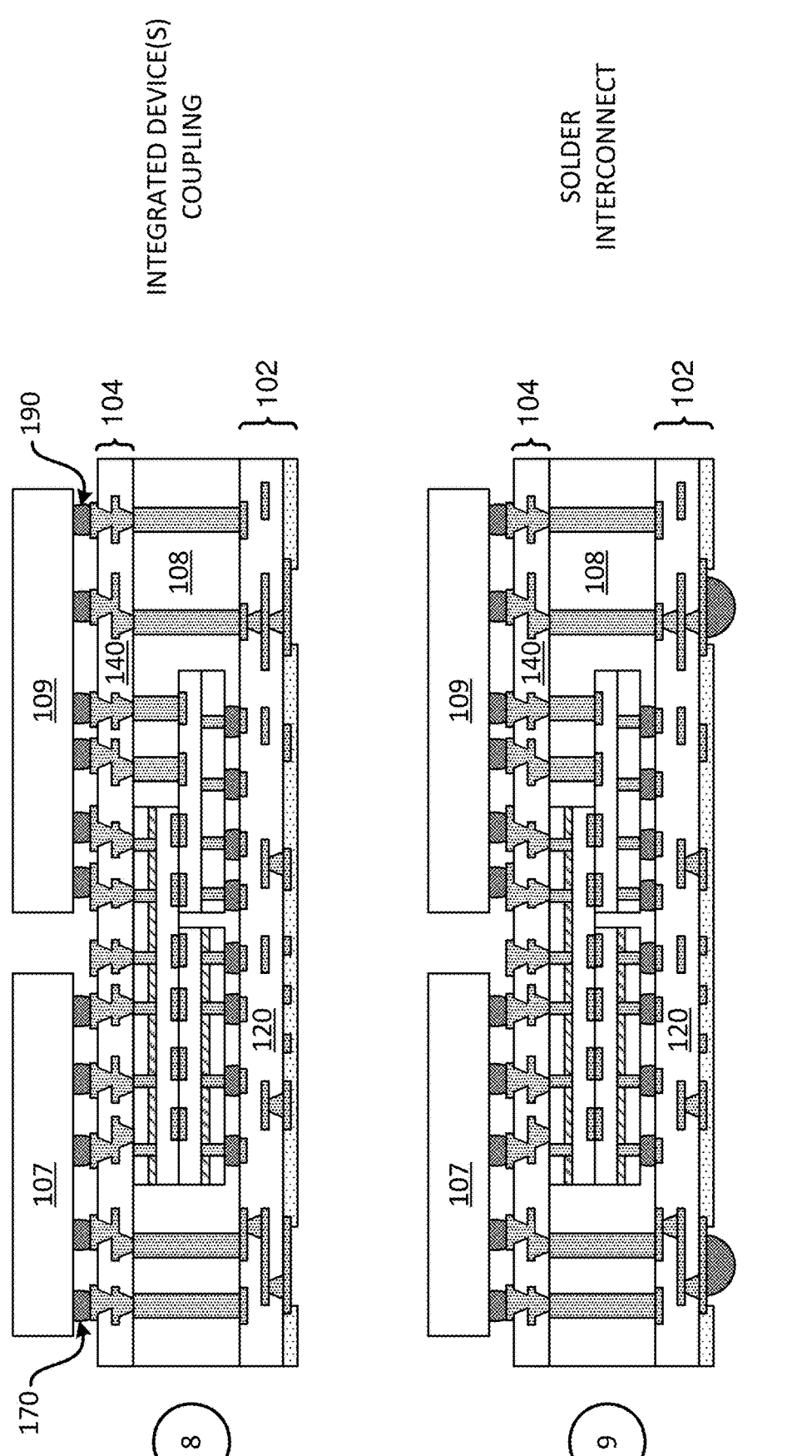

Exemplary Sequence for Fabricating a Package Comprising an Integrated Device and a Chiplet FIGS. 15A-15C illustrate an exemplary sequence for providing or fabricating a package that includes an integrated device and a chiplet. In some implementations, the sequence of FIGS. 15A-15C may be used to provide or fabricate the package 100 of FIG. 1, or any of the packages described in the disclosure.

It should be noted that the sequence of FIGS. 15A-15C may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 15A-15C may be used to fabricate one package or several packages at a time (as part of a wafer).

Stage 1, as shown in FIG. 15A, illustrates a state after a substrate 102 is provided. The substrate 102 includes at least one dielectric layer 120 and a plurality of interconnects. The substrate 102 may also include a solder resist layer.

Stage 2 illustrates a state after a plurality of encapsulation interconnects 182 are formed and coupled to the substrate 102. A masking and plating process may be used to form the plurality of interconnects 182. The plurality of encapsulation interconnects 182 are coupled to the plurality of interconnects 122 of the substrate 102.

Stage 3 illustrates a state after a plurality of chiplets are coupled to the substrate 102. For example, a back side of the chiplet 101 is coupled to the substrate 102 through a plurality of solder interconnects 110. A back side of the chiplet 105 is coupled to the substrate 102 through a plurality of solder interconnects 150. A pick and place process may be used to couple the chiplets to the substrate.

Stage 4 illustrates a state after a chiplet 103 is coupled to the chiplet 101 and the chiplet 105. The front side of the chiplet 103 may be coupled to the front side of the chiplet 101 and the front side of the chiplet 103. A hybrid bonding process may be used to couple the chiplets together, such that interconnects from the chiplets touch each other.

Stage 5, as shown in FIG. 15B, illustrates a state after a plurality of encapsulation interconnects 1582 are formed and coupled to the chiplet 105. A masking and plating process may be used to form the plurality of interconnects 1582.

Stage 6 illustrates a state after an encapsulation layer 108 is formed and coupled to the substrate 102. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 may be overmolded and then portions of the encapsulation layer 108 may be removed.

Stage 7 illustrates a state after the metallization portion 104 is formed and coupled to the encapsulation layer 108. The encapsulation layer 108 may represent the encapsulation layer 108 and the encapsulation layer 1408. The metallization portion 104 includes at least one dielectric layer 140 and a plurality of metallization interconnects 142. The plurality of metallization portion may be coupled to the plurality of encapsulation interconnects 182. The plurality of encapsulation interconnects 182 may represent the plurality of encapsulation interconnects 182 and/or the plurality of encapsulation interconnects 1582.

Stage 8, as shown in FIG. 15C, illustrates a state after the integrated device 107 is coupled to the metallization portion 104 through a plurality of solder interconnects 170. Stage 8 also illustrates a state after the integrated device 109 is coupled to the metallization portion 104 through a plurality of solder interconnects 190. A solder reflow process may be used to couple the integrated devices to the metallization portion 104.

Stage 9 illustrates a state after a plurality of solder interconnects 129 are coupled to the substrate 102. A solder reflow process may be used to couple the plurality of solder interconnects 129 to the plurality of interconnects 122 of the substrate 102.

Exemplary Sequence for Fabricating a Package Comprising an Integrated Device and a Chiplet FIGS. 16A-16D illustrate an exemplary sequence for providing or fabricating a package that includes an integrated device and a chiplet. In some implementations, the sequence of FIGS. 16A-16D may be used to provide or fabricate the package 200 of FIG. 2, or any of the packages described in the disclosure.

It should be noted that the sequence of FIGS. 16A-16D may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 16A-16D may be used to fabricate one package or several packages at a time (as part of a wafer).

Figure 16A:
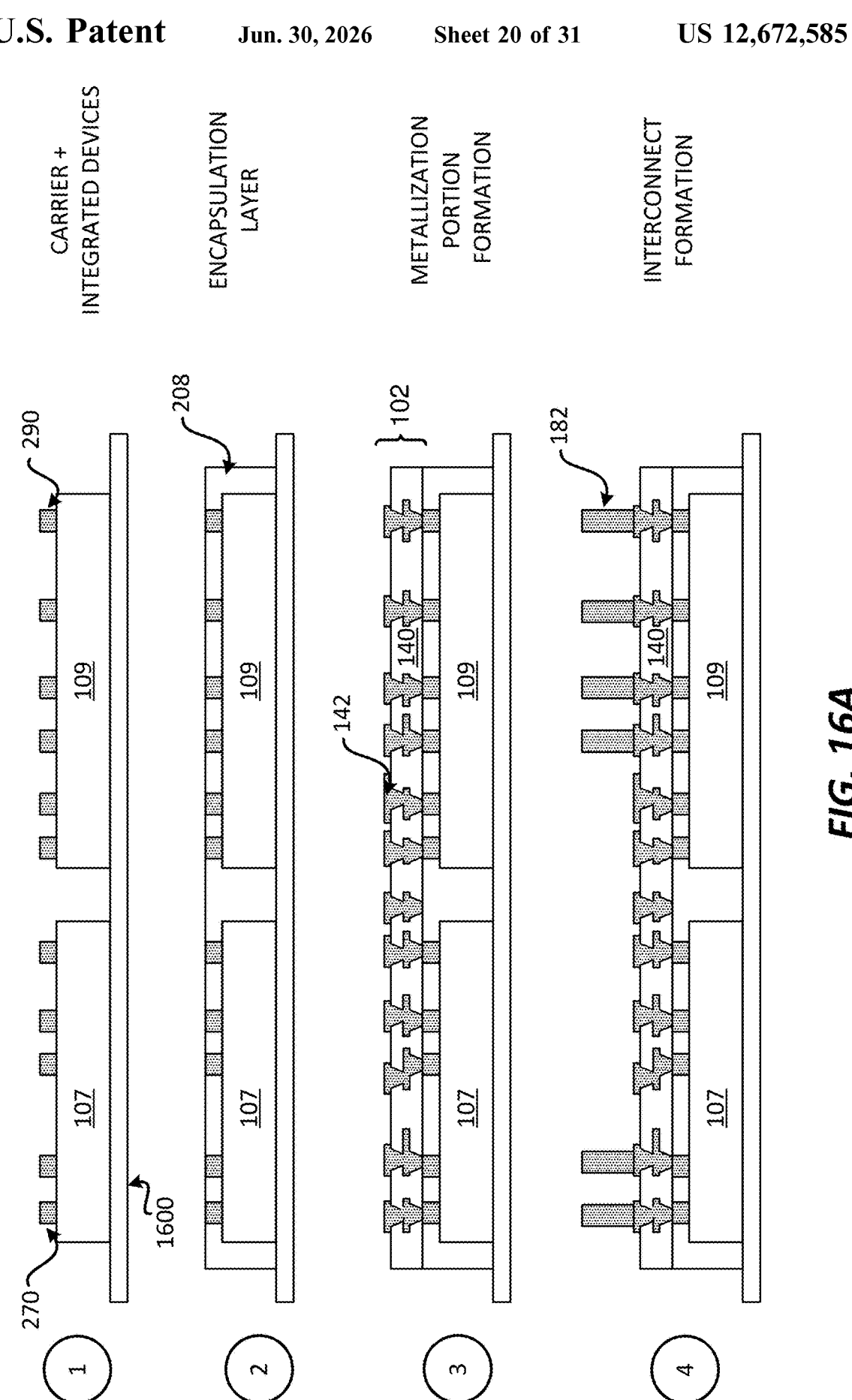

Stage 1, as shown in FIG. 16A, illustrates a state after an integrated device 107 and an integrated device 109 are provided on a carrier 1600. A pick and place process may be used to place the back side of the integrated device 107 and the back side of the integrated device 109 on the carrier 1600. The carrier 1600 may include a tape. The integrated device 107 may include a plurality of pillar interconnects 270. The integrated device 109 may include a plurality of pillar interconnects 290.

Stage 2 illustrates a state after an encapsulation layer 208 is formed over the carrier 1400, the integrated device 107 and the integrated device 109. The encapsulation layer 108 is coupled to the carrier 1400, the integrated device 107 and the integrated device 109. The encapsulation layer 208 may encapsulate the plurality of pillar interconnects 270 and the plurality of pillar interconnects 290. The encapsulation layer 208 may include a mold, a resin and/or an epoxy. The encapsulation layer 208 may be a means for encapsulation. The encapsulation layer 208 may be provided by using a compression and transfer molding process, a sheet molding process, or a liquid molding process. In some implementations, the encapsulation layer 208 is provided and then a polishing and/or grinding process is performed to remove portions of the encapsulation layer 208 and/or portions of the pillar interconnects 270 of the integrated device 107 and/or portions of the pillar interconnects 290 of the integrated device 109, so as to create a planar surface.

Stage 3 illustrates a state after the metallization portion 104 is formed and coupled to the encapsulation layer 108. The metallization portion 104 includes at least one dielectric layer 140 and a plurality of metallization interconnects 142. The plurality of metallization interconnects 142 may be coupled to the integrated devices (e.g., 107 109) through a plurality pillar interconnects (e.g., 270, 290)

Stage 4 illustrates a state after a plurality of encapsulation interconnects 182 are formed and coupled to the metallization portion 104. A masking and plating process may be used to form the plurality of interconnects 182. The plurality of encapsulation interconnects 182 are coupled to the plurality of metallization interconnects 142 of the metallization portion 104.

Figure 16B:
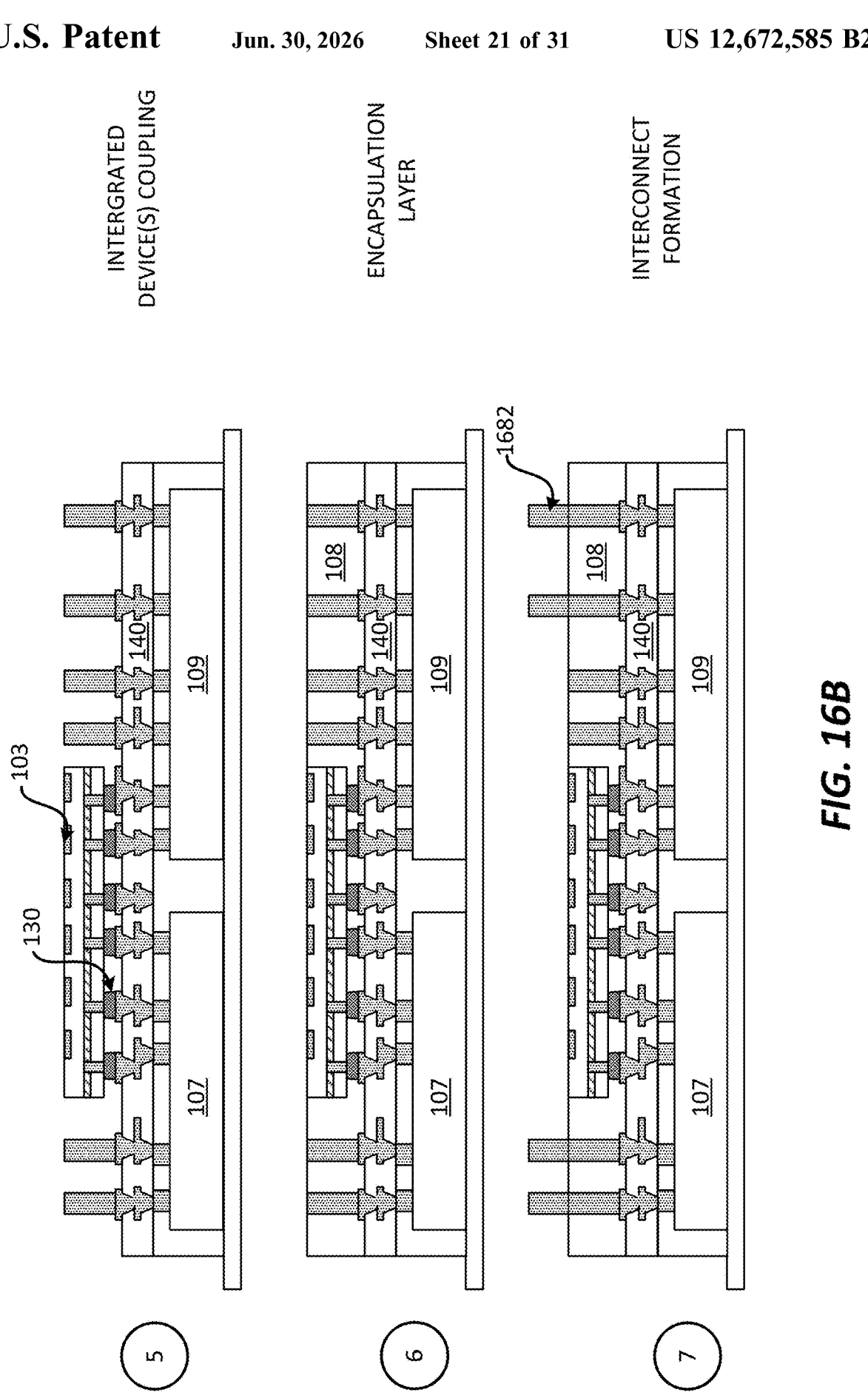

Stage 5, as shown in FIG. 16B, illustrates a state after the chiplet 103 is coupled to the plurality of metallization interconnects 142 of the metallization portion 104 through a plurality of solder interconnects 230. The back side of the chiplet 103 may be coupled to the metallization portion 104. A solder reflow process may be used to couple the chiplet 103 to the metallization portion 104

Stage 6 illustrates a state after an encapsulation layer 108 is formed over the metallization portion 104, the chiplet 103 and the plurality of encapsulation interconnects 182. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 108 and/or portions of the encapsulation interconnects 182, so as to create a planar surface.

Stage 7 illustrates a state after a plurality of encapsulation interconnects 1682 are formed and coupled to the plurality of encapsulation interconnects 182. A masking and plating process may be used to form the plurality of interconnects 1682.

Figure 16C:
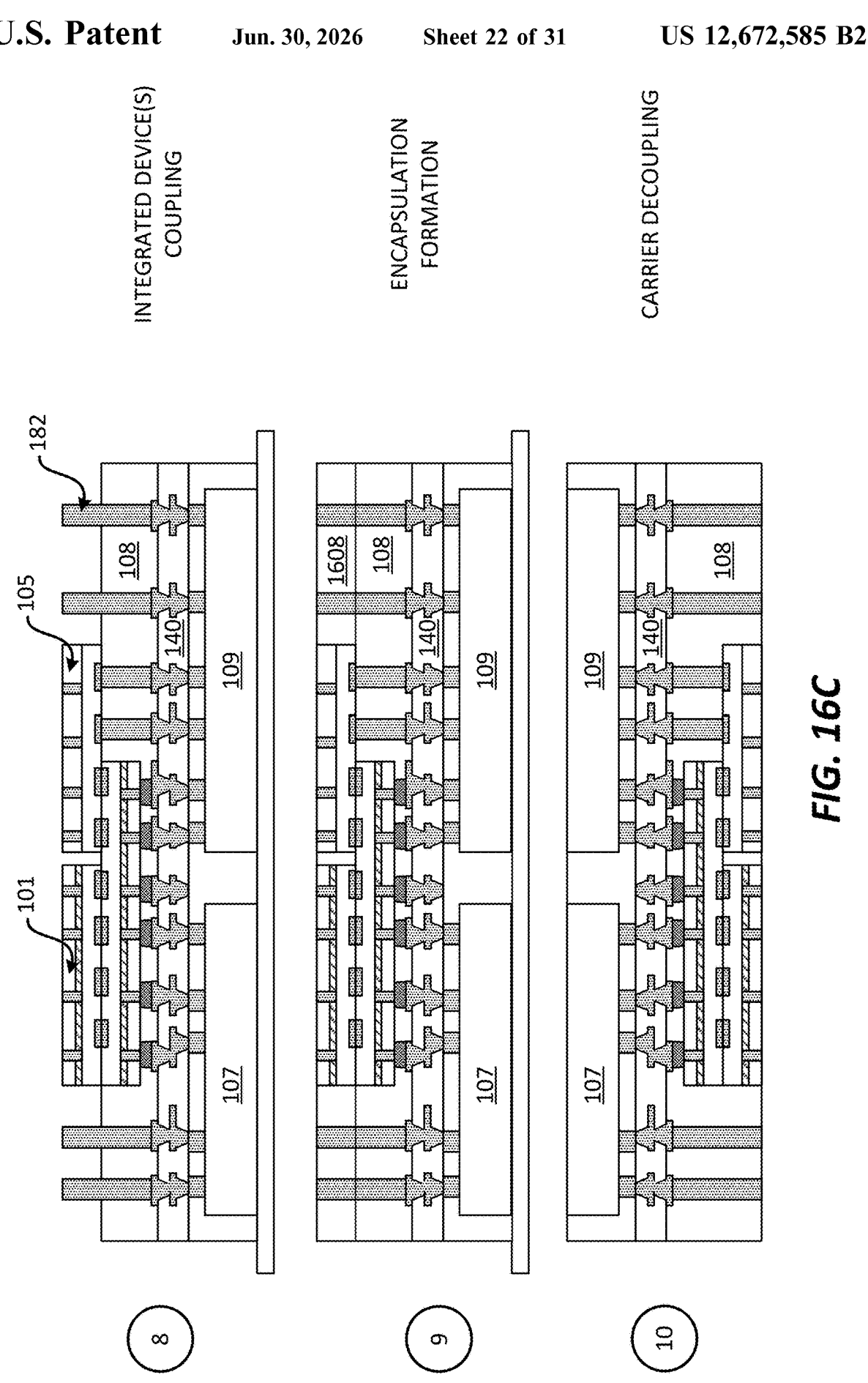

Stage 8, as shown in FIG. 16C, illustrates a state after the chiplet 101 and the chiplet 105 are coupled to the chiplet 103. A hybrid bonding process may be used to couple the chiplet 101 and the chiplet 105 such that the interconnects of the chiplets are in direct contact without the need of a solder interconnect. The front side of the chiplet 101 may be coupled to the front side of the chiplet 103. The front side of the chiplet 105 may be coupled to the front side of the chiplet 103. However, in some implementations, the back side of a chiplet may be coupled to a front side of chiplet. In some implementations, the back side of chiplet may be coupled to the back side of chiplet. The plurality of encapsulation interconnects 182 may represent the plurality of encapsulation interconnects 182 and the plurality of encapsulation interconnects 1682.

Stage 9 illustrates a state after an encapsulation layer 1608 is formed over the encapsulation layer 108 104, the chiplet 103, the chiplet 101, the chiplet 105 and the plurality of encapsulation interconnects 182. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 1608 and/or portions of the encapsulation interconnects 182, so as to create a planar surface.

Stage 10 illustrates a state after the carrier 1600 is decoupled from the encapsulation layer 208. The encapsulation layer 108 may represent the encapsulation layer 108 and the encapsulation layer 1608.

Figure 16D:
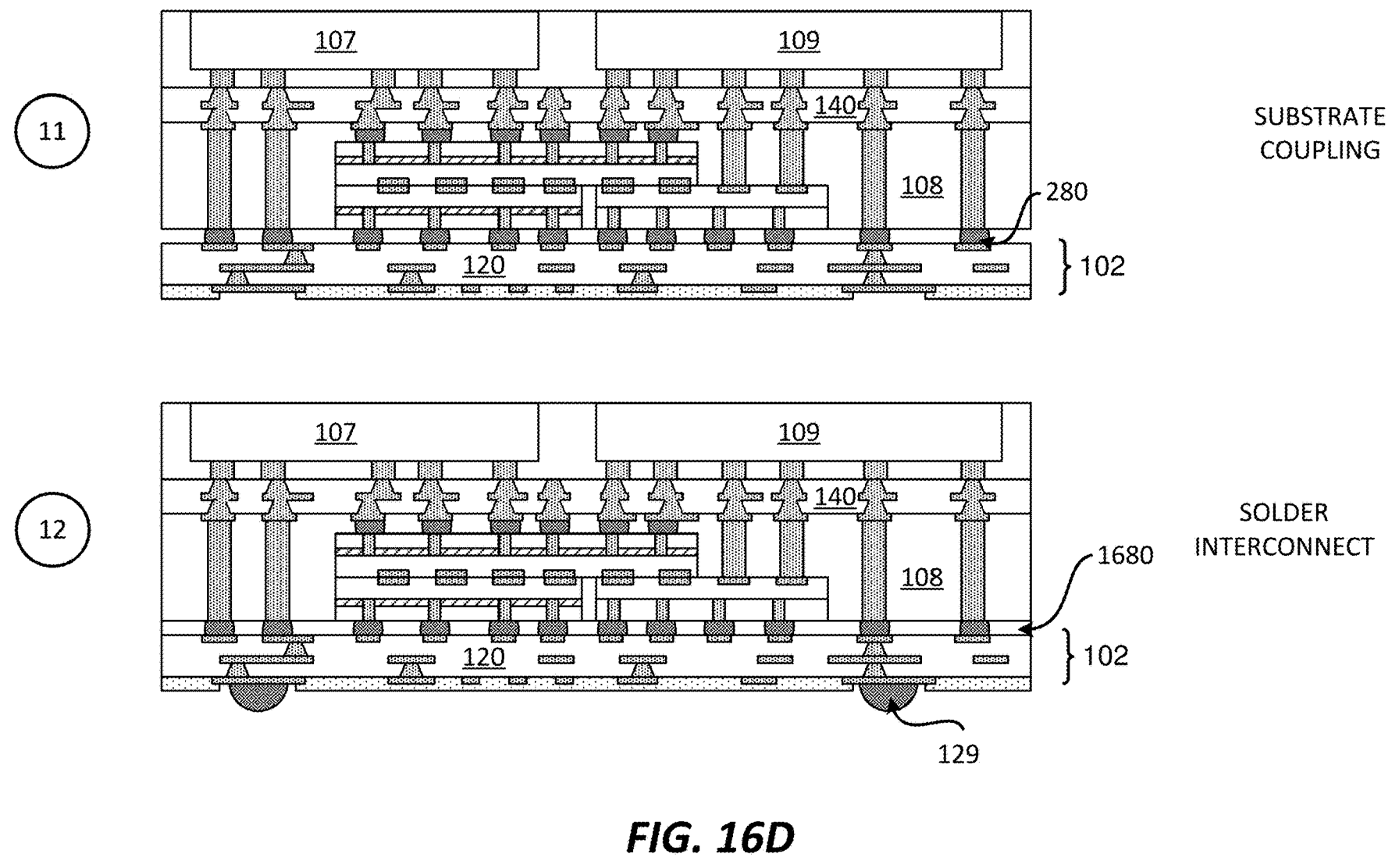

Stage 11 of FIG. 16D, illustrates a state after a package is coupled to the substrate 102 through a plurality of solder interconnects 280. The chiplet 101 and the chiplet 105 are coupled to the substrate 102 through the plurality of solder interconnects 280. The plurality of encapsulation interconnects 182 are coupled to the substrate 102 through the plurality of solder interconnects 280. The substrate 102 includes at least one dielectric layer 120 and a plurality of interconnects 122.

Stage 12 illustrates a state after an encapsulation layer 1680 is provided between the encapsulation layer 108 and the substrate 102. The encapsulation layer 1680 may be considered part of the encapsulation layer 108. Stage 12 also illustrates a state after a plurality of solder interconnects 129 are coupled to the substrate 102. A solder reflow process may be used to couple the plurality of solder interconnects 129 to the plurality of interconnects 122 of the substrate 102.

Exemplary Sequence for Fabricating a Package Comprising an Integrated Device and a Chiplet FIGS. 17A-17D illustrate an exemplary sequence for providing or fabricating a package that includes an integrated device and a chiplet. In some implementations, the sequence of FIGS. 17A-17D may be used to provide or fabricate the package 400 of FIG. 4, or any of the packages described in the disclosure.

It should be noted that the sequence of FIGS. 17A-17D may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 17A-17D may be used to fabricate one package or several packages at a time (as part of a wafer).

Figure 17A:
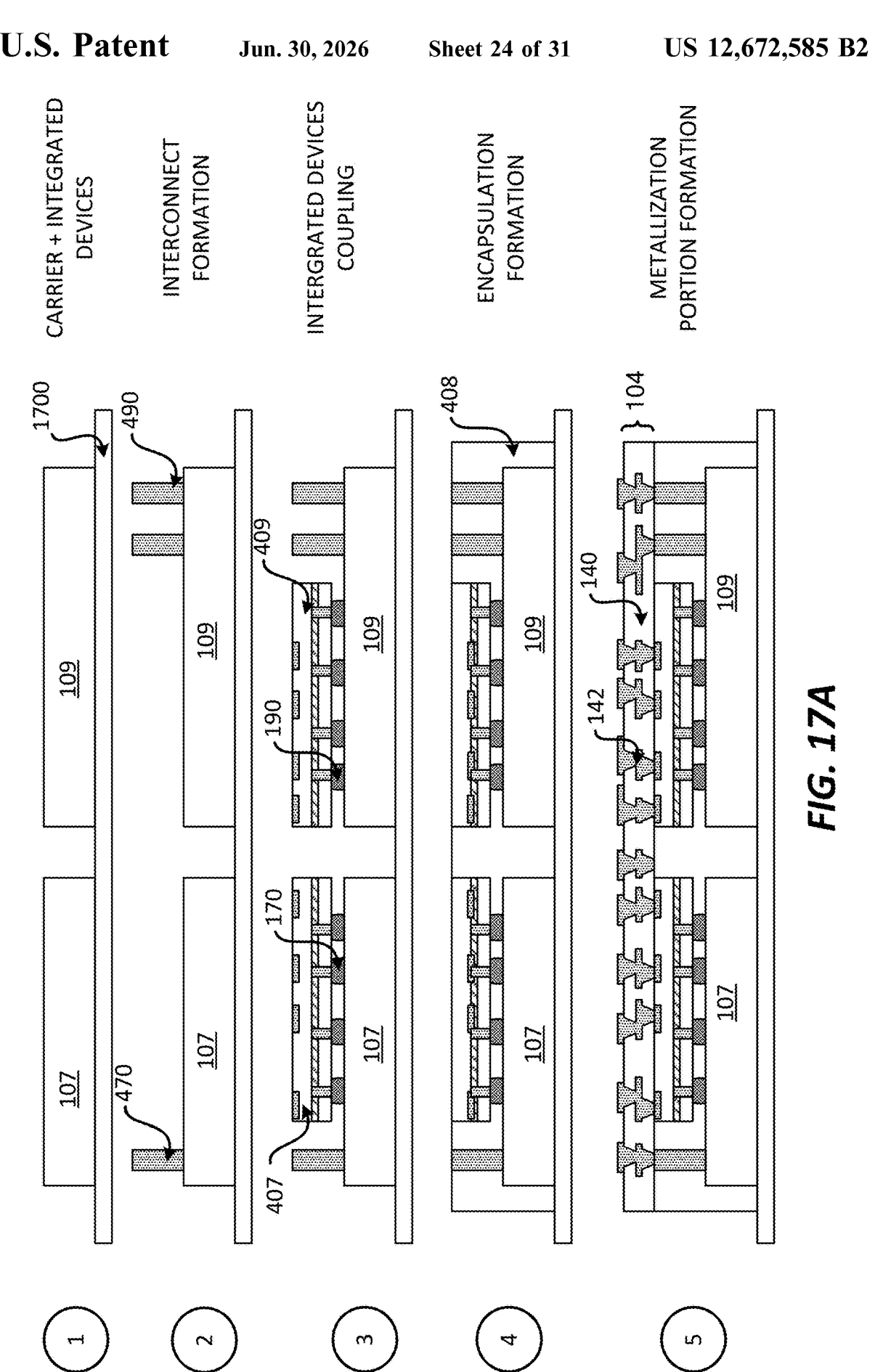

Stage 1, as shown in FIG. 17A, illustrates a state after an integrated device 107 and an integrated device 109 are provided on a carrier 1700. A pick and place process may be used to place the back side of the integrated device 107 and the back side of the integrated device 109 on the carrier 1600. The carrier 1600 may include a tape.

Stage 2 illustrates a state after a plurality of pillar interconnects 470 are formed and coupled to the integrated device 107 and a plurality of pillar interconnects 490 are formed and coupled to the integrated device 109. A masking and plating process may be used to form the plurality of pillar interconnects.

Stage 3 illustrates a state after a chiplet 407 is coupled to the integrated device 107 through a plurality of solder interconnects 170. A solder reflow process may be used to couple the chiplet 407 to the integrated device 107. Stage 3 also illustrates a state after a chiplet 409 is coupled to the integrated device 109 through a plurality of solder interconnects 190. A solder reflow process may be used to couple the chiplet 409 to the integrated device 109.

Stage 4 illustrates a state after an encapsulation layer 408 is formed over the carrier 1400, the integrated device 107, the integrated device 109, the plurality of pillar interconnects 470, the plurality of pillar interconnects 490, the chiplet 407 and the chiplet 409. The encapsulation layer 108 is coupled to the carrier 1400, the integrated device 107, the integrated device 109, the plurality of pillar interconnects 470, the plurality of pillar interconnects 490, the chiplet 407 and the chiplet 409. The encapsulation layer 408 may include a mold, a resin and/or an epoxy. The encapsulation layer 408 may be a means for encapsulation. The encapsulation layer 408 may be provided by using a compression and transfer molding process, a sheet molding process, or a liquid molding process. In some implementations, the encapsulation layer 408 is provided and then a polishing and/or grinding process is performed to remove portions of the encapsulation layer 408 and/or portions of the pillar interconnects 470 and/or portions of the pillar interconnects 490, so as to create a planar surface.

Stage 5 illustrates a state after the metallization portion 104 is formed and coupled to the encapsulation layer 408, the plurality of pillar interconnects 470, the plurality of pillar interconnects 490, the chiplet 407 and the chiplet 409. The metallization portion 104 includes at least one dielectric layer 140 and a plurality of metallization interconnects 142. The plurality of metallization interconnects 142 may be coupled to the integrated devices (e.g., 107 109) through a plurality pillar interconnects (e.g., 470, 490)

Figure 17B:
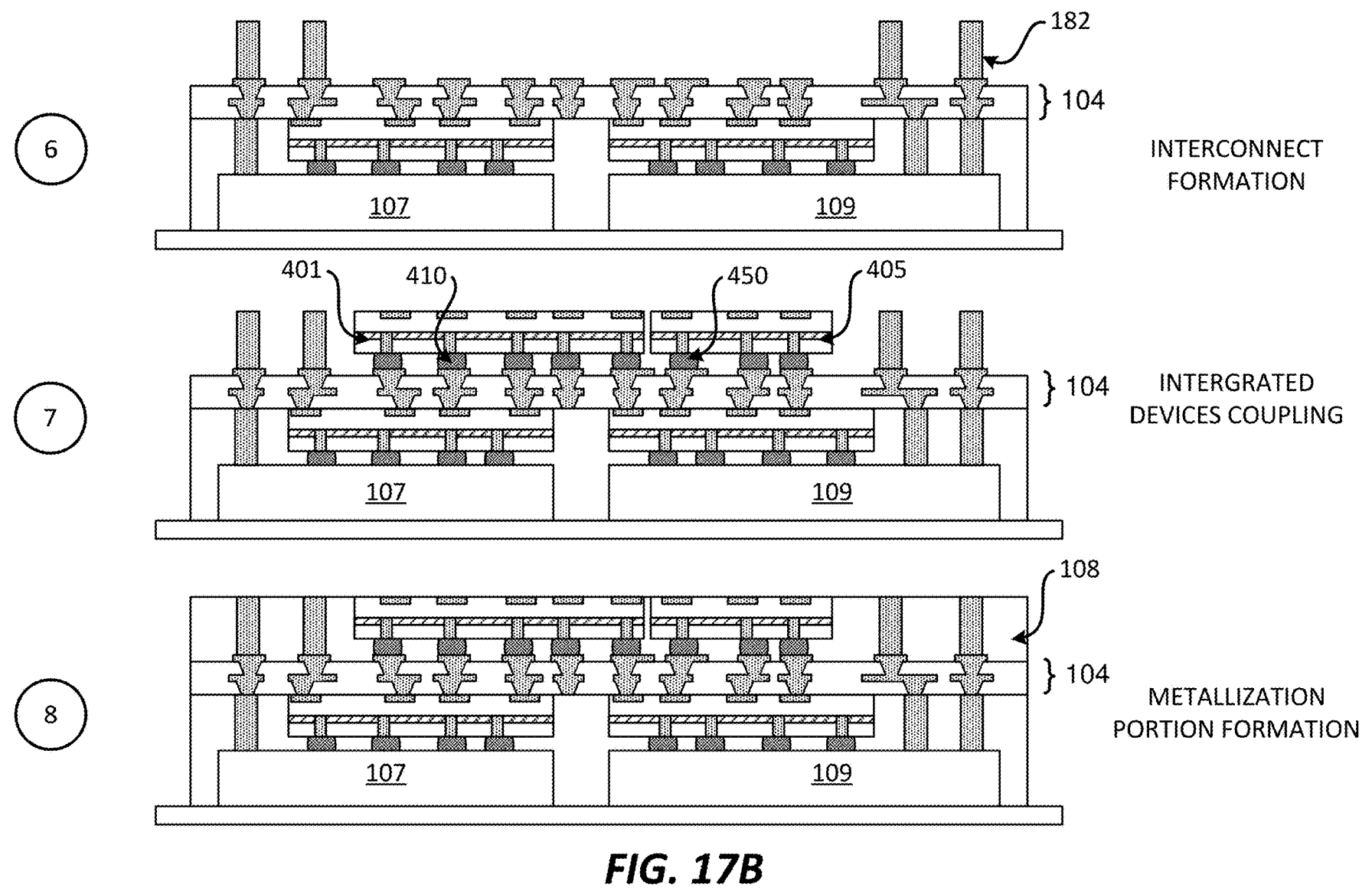

Stage 6, as shown in FIG. 17B, illustrates a state after a plurality of encapsulation interconnects 182 are formed and coupled to the metallization portion 104. A masking and plating process may be used to form the plurality of interconnects 182. The plurality of encapsulation interconnects 182 are coupled to the plurality of metallization interconnects 142 of the metallization portion 104.

Stage 7 illustrates a state after the chiplet 401 is coupled to the plurality of metallization interconnects 142 of the metallization portion 104 through a plurality of solder interconnects 410. The back side of the chiplet 401 may be coupled to the metallization portion 104. A solder reflow process may be used to couple the chiplet 401 to the metallization portion 104

Stage 7 also illustrates a state after the chiplet 405 is coupled to the plurality of metallization interconnects 142 of the metallization portion 104 through a plurality of solder interconnects 450. The back side of the chiplet 405 may be coupled to the metallization portion 104. A solder reflow process may be used to couple the chiplet 405 to the metallization portion 104

Stage 8 illustrates a state after an encapsulation layer 108 is formed over the metallization portion 104, the chiplet 401, the chiplet 405 and the plurality of encapsulation interconnects 182. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. In some implementations, the encapsulation layer 108 is provided and then a polishing and/or grinding process is performed to remove portions of the encapsulation layer 108 and/or portions of the encapsulation interconnects 182, so as to create a planar surface.

Figure 17C:
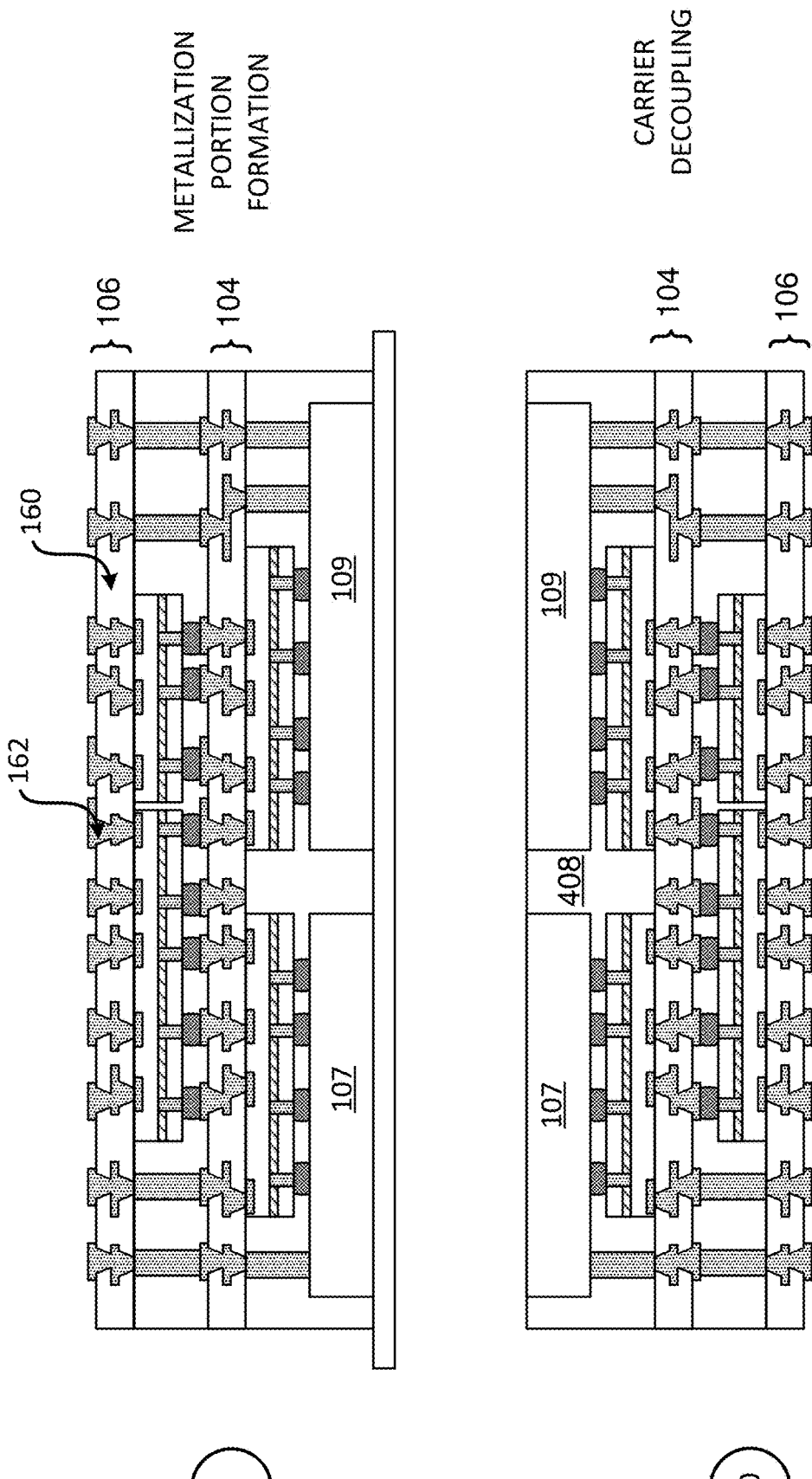

Stage 9, as shown in FIG. 17C, illustrates a state after the metallization portion 106 is formed and coupled to the encapsulation layer 108, the chiplet 401 and the chiplet 405. The metallization portion 106 includes at least one dielectric layer 160 and a plurality of metallization interconnects 162.

Stage 10 illustrates a state after the carrier 1700 is decoupled from the encapsulation layer 408.

Figure 17D:
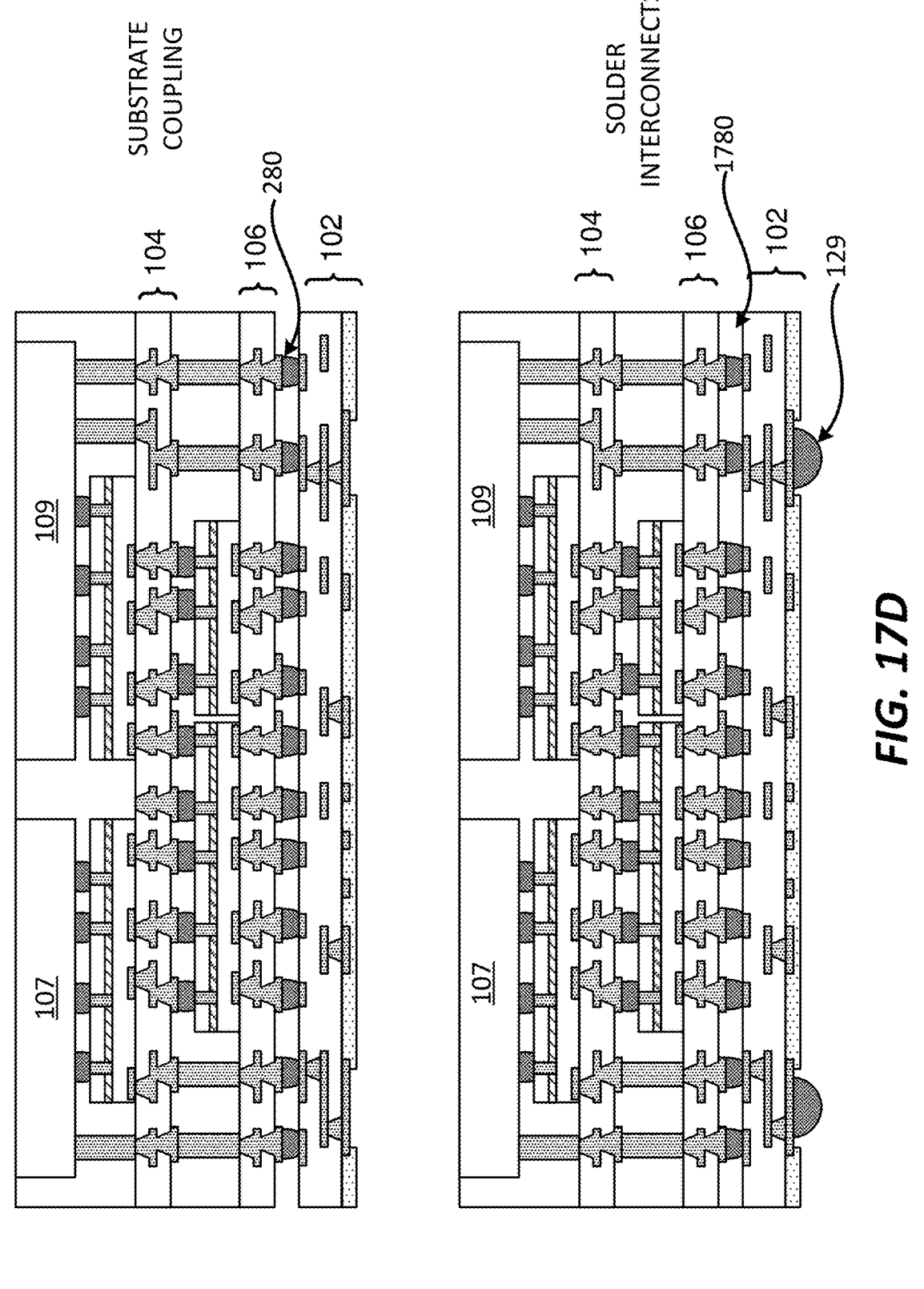

Stage 11 of FIG. 17D, illustrates a state after a package is coupled to the substrate 102 through a plurality of solder interconnects 280. The metallization portion 106 may be coupled to the substrate 102 through the plurality of solder interconnects 280. The plurality of metallization interconnects 162 are coupled to the substrate 102 through the plurality of solder interconnects 280. The substrate 102 includes at least one dielectric layer 120 and a plurality of interconnects 122.

Stage 12 illustrates a state after an encapsulation layer 1780 is provided between the substrate 102 and the metallization portion 106. Stage 12 also illustrates a state after a plurality of solder interconnects 129 are coupled to the substrate 102. A solder reflow process may be used to couple the plurality of solder interconnects 129 to the plurality of interconnects 122 of the substrate 102.

Any of the metallization portions may be a first metallization portion, and/or any of the metallization portions may be a second metallization portion. For example, in some implementations, the metallization portion 104 may be considered a first metallization portion, and the metallization portion 106 may be considered a second metallization portion. In some implementations, the metallization portion 106 may be considered a first metallization portion, and the metallization portion 104 may be considered a second metallization portion.

Exemplary Sequence for Fabricating a Metallization Portion

Figure 18A:
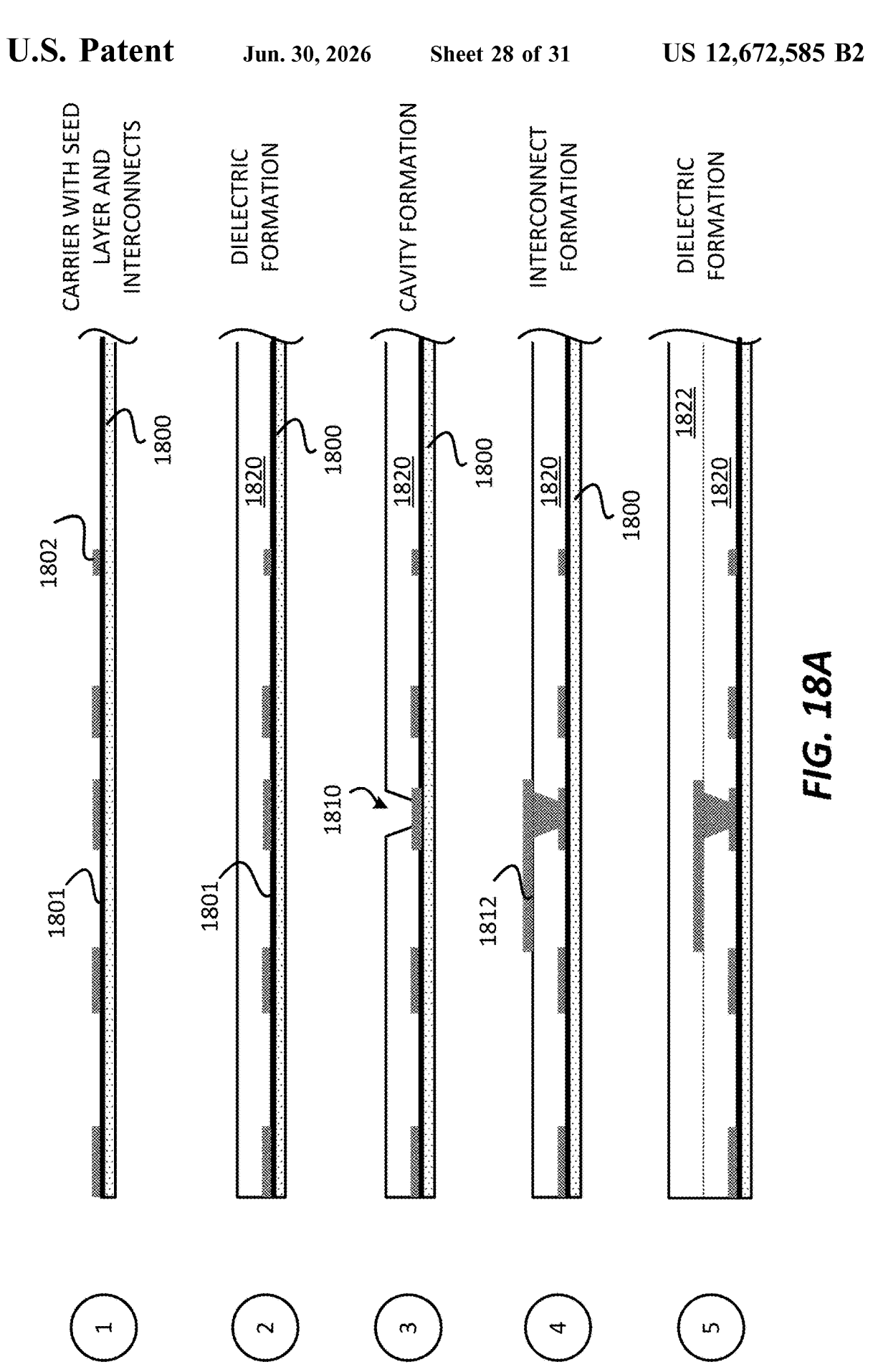
FIGS. 18A-18B illustrate an exemplary sequence for fabricating a substrate.
Figure 18B:
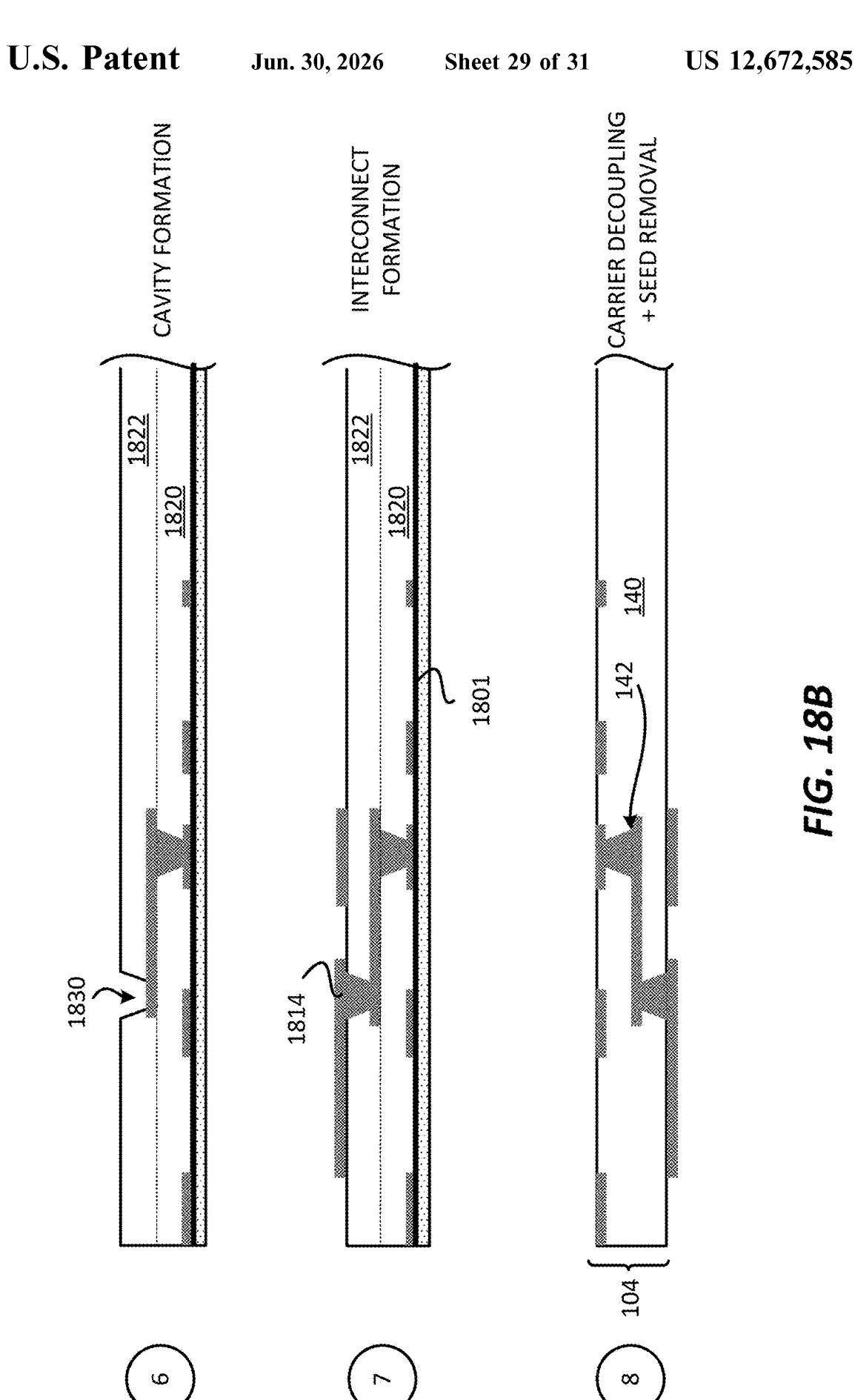

In some implementations, fabricating a substrate includes several processes. FIGS. 18A-18B illustrate an exemplary sequence for providing or fabricating a metallization portion. In some implementations, the sequence of FIGS. 18A-18B may be used to provide or fabricate the metallization portion 104. However, the process of FIGS. 18A-18B may be used to fabricate any of the metallization portions described in the disclosure. In some implementations, the process of FIGS. 18A-18B may be used to fabricate a substrate.

It should be noted that the sequence of FIGS. 18A-18B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 18A, illustrates a state after a carrier 1800 is provided. A seed layer 1801 and interconnects 1802 may be located over the carrier 1800. The interconnects 1802 may be located over the seed layer 1801. A plating process and etching process may be used to form the interconnects 1802. In some implementations, the carrier 1800 may be provided with the seed layer 1801 and a metal layer that is patterned to form the interconnects 1802. The interconnects 1802 may represent at least some of the interconnects from the plurality of interconnects 192.

Stage 2 illustrates a state after a dielectric layer 1820 is formed over the carrier 1800, the seed layer 1801 and the interconnects 1802. A deposition and/or lamination process may be used to form the dielectric layer 1820. The dielectric layer 1820 may include prepreg and/or polyimide. The dielectric layer 1820 may include a photo-imagable dielectric. However, different implementations may use different materials for the dielectric layer.

Stage 3 illustrates a state after a plurality of cavities 1810 is formed in the dielectric layer 1820. The plurality of cavities 1810 may be formed using a photolithography process or laser process.

Stage 4 illustrates a state after interconnects 1812 are formed in and over the dielectric layer 1820, including in and over the plurality of cavities 1810. For example, a via, pad and/or traces may be formed. A plating process may be used to form the interconnects.

Stage 5 illustrates a state after a dielectric layer 1822 is formed over the dielectric layer 1820 and the interconnects 1812. A deposition and/or lamination process may be used to form the dielectric layer 1822. The dielectric layer 1822 may include prepreg and/or polyimide. The dielectric layer 1822 may include a photo-imagable dielectric. However, different implementations may use different materials for the dielectric layer.

Stage 6, as shown in FIG. 18B, illustrates a state after a plurality of cavities 1830 is formed in the dielectric layer 1822. The plurality of cavities 1830 may be formed using a photolithography process or laser process.

Stage 7 illustrates a state after interconnects 1814 are formed in and over the dielectric layer 1822, including in and over the plurality of cavities 1830. For example, a via, pad and/or traces may be formed. A plating process may be used to form the interconnects.

Stage 8 illustrates a state after the carrier 1800 is decoupled (e.g., detached, removed, grinded out) from at least one dielectric layer 1820 and the seed layer 1801, portions of the seed layer 1801 are removed (e.g., etched out), leaving the metallization portion 104 that includes at least one dielectric layer 1820 and the plurality of interconnects 192. The at least one dielectric layer 140 may represent the dielectric layer 1820 and/or the dielectric layer 1822. The plurality of metallization interconnects 142 may represent the interconnects 1802, 1812 and/or 1814.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Metallization Portion

In some implementations, fabricating a substrate includes several processes. FIG. 19 illustrates an exemplary flow diagram of a method 1900 for providing or fabricating a metallization portion. In some implementations, the method 1900 of FIG. 19 may be used to provide or fabricate the substrate(s) of the disclosure. For example, the method 1900 of FIG. 19 may be used to fabricate the metallization portion 104.

It should be noted that the method 1900 of FIG. 19 may combine one or more processes in order to simplify and/or clarify the method for providing or fabricating a substrate. In some implementations, the order of the processes may be changed or modified.

The method provides (at 1905) a carrier (e.g., 1800). Different implementations may use different materials for the carrier 1800. The carrier 1800 may include a seed layer (e.g., 1801). The seed layer 1801 may include a metal (e.g., copper). The carrier may include a substrate, glass, quartz and/or carrier tape. Stage 1 of FIG. 18A illustrates and describes an example of a carrier with a seed layer that is provided.

The method forms and patterns (at 1910) interconnects over the carrier 1800 and the seed layer 1801. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 192). Stage 1 of FIG. 18A illustrates and describes an example of forming and patterning interconnects over a seed layer and a carrier.

The method forms/provides (at 1915) a dielectric layer 1820 over the seed layer 1801, the carrier 1800 and the interconnects 1802. A deposition and/or lamination process may be used to form the dielectric layer 1820. The dielectric layer 1820 may include prepreg and/or polyimide. The dielectric layer 1820 may include a photo-imagable dielectric. Forming the dielectric layer 1820 may also include forming a plurality of cavities (e.g., 1810) in the dielectric layer 1820. The plurality of cavities may be formed using a photolithography or laser process. Stages 2-3 of FIG. 18A illustrate and describe an example of forming a dielectric layer and cavities in the dielectric layer.

The method forms (at 1920) interconnects in and over the dielectric layer. For example, the interconnects 1812 may be formed in and over the dielectric layer 1820. A plating process may be used to form the interconnects. Forming interconnects may include providing a patterned metal layer over and/or in the dielectric layer. Forming interconnects may also include forming interconnects in cavities of the dielectric layer. Stage 4 of FIG. 18A illustrates and describes an example of forming interconnects in and over a dielectric layer.

The method forms/provides (at 1925) a dielectric layer 1822 over the dielectric layer 1820 and the interconnects 1812. A deposition and/or lamination process may be used to form the dielectric layer 1822. The dielectric layer 1822 may include prepreg and/or polyimide. The dielectric layer 1822 may include a photo-imagable dielectric. Forming the dielectric layer 1822 may also include forming a plurality of cavities (e.g., 1830) in the dielectric layer 1822. The plurality of cavities may be formed using a photolithography process or laser process. Stages 5-6 of FIGS. 18A-18B illustrate and describe an example of forming a dielectric layer and cavities in the dielectric layer.

The method forms (at 1930) interconnects in and over the dielectric layer. For example, the interconnects 1814 may be formed in and over the dielectric layer 1822. A plating process may be used to form the interconnects. Forming interconnects may include providing a patterned metal layer over and/or in the dielectric layer. Forming interconnects may also include forming interconnects in cavities of the dielectric layer. Stage 7 of FIG. 18B illustrates and describes an example of forming interconnects in and over a dielectric layer. The method may form additional dielectric layer(s) and additional interconnects as described at 1925 and 1930.

In some implementations, once all the dielectric layer(s) and additional interconnects are formed, the method may decouple (at 1935) the carrier (e.g., 1800) from the seed layer (e.g., 1801). The carrier 1800 may be detached and/or grinded off. The method may also remove (at 1935) portions of the seed layer (e.g., 1801). An etching process may be used to remove portions of the seed layer 1801. Stage 8 of FIG. 18B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 20:
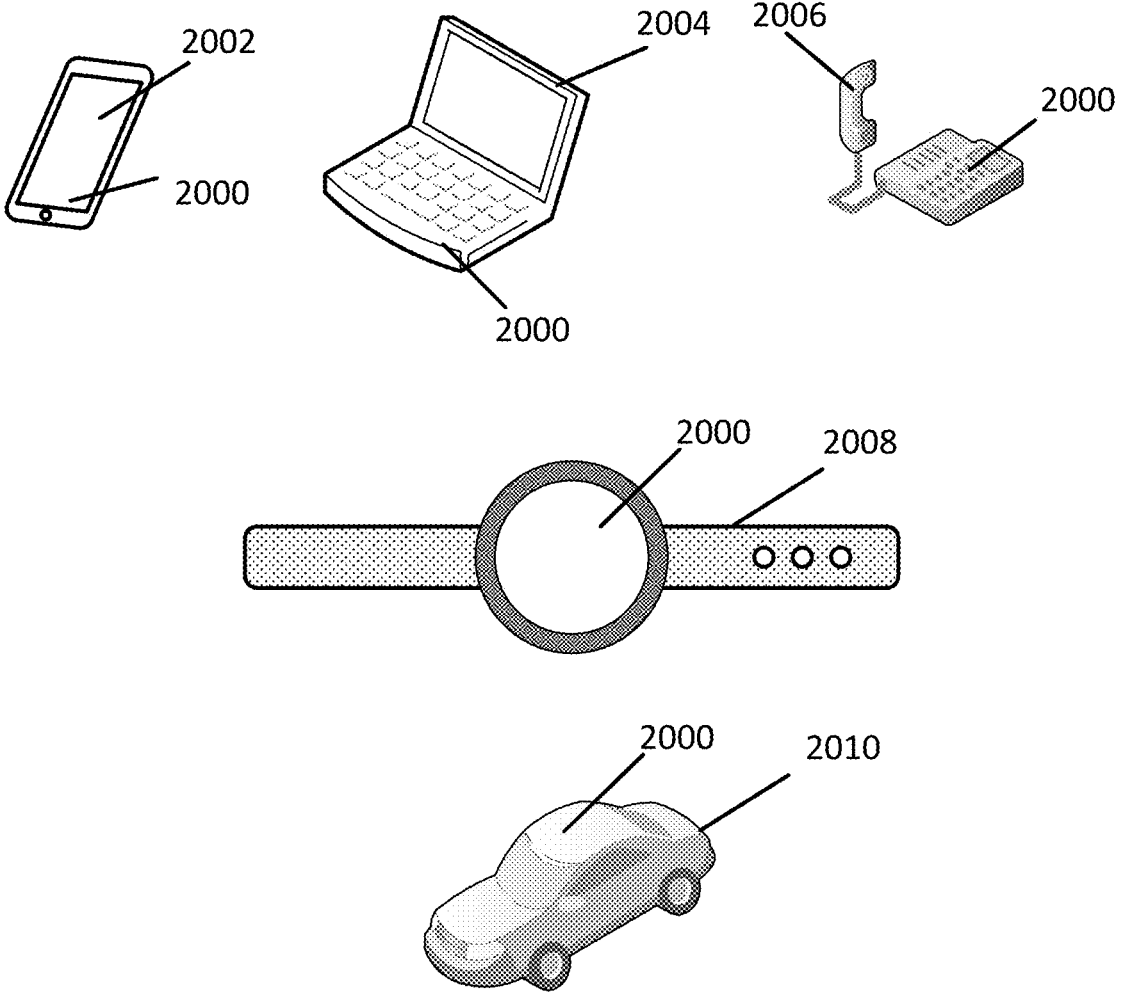
FIG. 20 illustrates various electronic devices that may integrate a die, an electronic circuit, an integrated device, an integrated passive device (IPD), a passive component, a package, and/or a device package described herein.

FIG. 20 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2002, a laptop computer device 2004, a fixed location terminal device 2006, a wearable device 2008, or automotive vehicle 2010 may include a device 2000 as described herein. The device 2000 may be, for example, any of the devices and/or integrated circuit (IC) packages described herein. The devices 2002, 2004, 2006 and 2008 and the vehicle 2010 illustrated in FIG. 20 are merely exemplary. Other electronic devices may also feature the device 2000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-13, 14A-14C, 15A-15C, 16A-16D, 17A-17D, 18A-18B and/or 19-20 may be rearranged and/or combined into a single component, process, feature or function or embodied in several components, processes, or functions. Additional elements, components, processes, and/or functions may also be added without departing from the disclosure. It should also be noted FIGS. 1-13, 14A-14C, 15A-15C, 16A-16D, 17A-17D, 18A-18B and/or 19-20 and its corresponding description in the present disclosure is not limited to dies and/or ICs. In some implementations, FIGS. 1-13, 14A-14C, 15A-15C. 16A-16D, 17A-17D. 18A-18B and/or 19-20 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object that is coupled to another object may be coupled to at least part of the another object. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate comprising at least one dielectric layer and a plurality of interconnects; a first chiplet coupled to the substrate; a second chiplet coupled to the first chiplet; an encapsulation layer coupled to the substrate, the first chiplet and the second chiplet; a plurality of encapsulation interconnects located in the encapsulation layer; a metallization portion coupled to the encapsulation layer, the second chiplet and the plurality of encapsulation interconnects; and a first integrated device coupled to the metallization portion.

Aspect 2: The package of aspect 1, wherein the first chiplet includes a first front side and a first back side, wherein the second chiplet includes a second front side and a second back side, and wherein the first front side of the first chiplet is coupled to the second front side of the second chiplet.

Aspect 3: The package of aspects 1 through 2, wherein the first chiplet includes a first plurality of through substrate vias, and wherein the second chiplet includes a second plurality of through substrate vias.

Aspect 4: The package of aspects 1 through 3, further comprising a third chiplet coupled to the substrate.

Aspect 5: The package of aspect 4, wherein the second chiplet is coupled to the third chiplet.

Aspect 6: The package of aspect 5, wherein the first chiplet includes a first front side and a first back side, wherein the second chiplet includes a second front side and a second back side, wherein the second chiplet includes a third front side and a third back side, wherein the first front side of the first chiplet is coupled to the second front side of the second chiplet, and wherein the third front side of the third chiplet is coupled to the second front side of the second chiplet.

Aspect 7: The package of aspect 6, wherein the third chiplet includes a deep trench capacitor.

Aspect 8: The package of aspect 4, wherein the first chiplet is coupled to the third chiplet.

Aspect 9: The package of aspect 8, wherein the first chiplet includes a first front side and a first back side, wherein the second chiplet includes a second front side and a second back side, wherein the second chiplet includes a third front side and a third back side, wherein the first front side of the first chiplet is coupled to the second front side of the second chiplet, and wherein the third front side of the third chiplet is coupled to the first front side of the first chiplet.

Aspect 10: The package of aspects 1 through 9, wherein an electrical path between the substrate and the first integrated device includes interconnects from the first chiplet and interconnects from the second chiplet.

Aspect 11: A package comprising a first metallization portion; a first chiplet coupled to the first metallization portion; an encapsulation layer coupled to the first metallization portion, the first chiplet; a plurality of encapsulation interconnects located in the encapsulation layer; a second metallization portion coupled to the encapsulation layer, the first chiplet, and the plurality of encapsulation interconnects; a second chiplet coupled to the second metallization portion; and a first integrated device coupled to the second chiplet and the second metallization portion such that the second chiplet is located between the first integrated device and the second metallization portion, wherein the first integrated device is coupled to the second chiplet through a plurality of solder interconnects.

Aspect 12: The package of aspect 11, wherein the first chiplet includes a first front side and a first back side, wherein the second chiplet includes a second front side and a second back side, and wherein the first front side of the first chiplet is coupled to the second metallization portion through a first plurality of solder interconnects, and wherein the second front side of the second chiplet is coupled to the second metallization portion through a second plurality of solder interconnects.

Aspect 13: The package of aspects 11 through 12, wherein the first chiplet and the second chiplet are configured to be coupled to a power distribution network.

Aspect 14: A device comprising a package comprising a substrate comprising at least one dielectric layer and a plurality of interconnects; a bridge located in the substrate; a first chiplet coupled to the substrate; a second chiplet; an encapsulation layer coupled to the substrate, the first chiplet and the second chiplet; a plurality of encapsulation interconnects located in the encapsulation layer; a metallization portion coupled to the encapsulation layer, the second chiplet and the plurality of encapsulation interconnects: and a first integrated device coupled to the metallization portion.

Aspect 15: The device of aspect 14, wherein the first chiplet includes a first front side and a first back side, and wherein the first front side of the first chiplet is coupled to the bridge located in the substrate.

Aspect 16: The device of aspects 14 through 15, wherein at least one encapsulation interconnect from the plurality of encapsulation interconnects is coupled to the bridge.

Aspect 17: The device of aspects 14 through 16, wherein at least one encapsulation interconnect from the plurality of encapsulation interconnects is coupled to the second chiplet.

Aspect 18: The device of aspects 14 through 17, wherein the first chiplet is configured to be coupled to a power distribution network.

Aspect 19: The device of aspects 14 through 18, wherein the first chiplet and/or the second chiplet includes a deep trench capacitor.

Aspect 20: The device of aspects 14 through 19, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising at least one dielectric layer and a plurality of interconnects;
a first chiplet coupled to the substrate through a first plurality of solder interconnects,
wherein the first chiplet includes a first front side and a first back side,
wherein the first chiplet includes a first plurality of through substrate vias, and
wherein the first plurality of solder interconnects touch (i) the first plurality of through substrate vias and (ii) interconnects from the plurality of interconnects of the substrate;
a second chiplet coupled to and touching the first chiplet,
wherein the second chiplet includes a second front side and a second back side, and
wherein the second front side of the second chiplet is coupled to and faces in a direction towards the first front side of the first chiplet;
an encapsulation layer coupled to the substrate, the first chiplet and the second chiplet;
a plurality of encapsulation interconnects located in the encapsulation layer;
a metallization portion coupled to the encapsulation layer, the second chiplet and the plurality of encapsulation interconnects; and
a first integrated device coupled to the metallization portion.

2. The package of claim 1,
wherein pad interconnects from the first front side of the first chiplet are coupled to and touch pad interconnects from the second front side of the second chiplet.

3. The package of claim 1,
wherein the second chiplet includes a second plurality of through substrate vias.

4. The package of claim 1, further comprising a third chiplet coupled to the substrate.

5. The package of claim 4, wherein the second chiplet is coupled to and touching the third chiplet.

6. The package of claim 5,
wherein the third chiplet includes a third front side and a third back side,
wherein the third front side of the third chiplet is coupled to and faces in a direction towards the second front side of the second chiplet, and
wherein pad interconnects from the first front side of the first chiplet are coupled to and touch pad interconnects from the second front side of the second chiplet.

7. The package of claim 6, wherein the third chiplet includes a deep trench capacitor.

8. The package of claim 4, wherein the first chiplet is coupled to and touching the third chiplet.

9. The package of claim 8,
wherein the third chiplet includes a third front side and a third back side,
wherein the third front side of the third chiplet is coupled to and faces in a direction towards the first front side of the first chiplet, and
wherein pad interconnects from the first front side of the first chiplet are coupled to and touch pad interconnects from the third front side of the third chiplet.

10. The package of claim 1, wherein an electrical path between the substrate and the first integrated device includes interconnects from the first chiplet and interconnects from the second chiplet.

11. A package comprising:
a first metallization portion;
a first chiplet coupled to the first metallization portion;
an encapsulation layer coupled to the first metallization portion and the first chiplet;
a plurality of encapsulation interconnects located in the encapsulation layer;
a second metallization portion coupled to the encapsulation layer, the first chiplet, and the plurality of encapsulation interconnects, wherein the first chiplet is located between the first metallization portion and the second metallization portion;
a second chiplet coupled to the second metallization portion, wherein the second metallization portion is located between the first chiplet and the second chiplet; and
a first integrated device coupled to the second chiplet and the second metallization portion such that the second chiplet is located between the first integrated device and the second metallization portion, wherein the first integrated device is coupled to the second chiplet through a first plurality of solder interconnects, wherein the first plurality of solder interconnects touches (i) interconnects from the first integrated device and (ii) interconnects from the second chiplet.

12. The package of claim 11,
wherein the first chiplet includes a first front side and a first back side,
wherein the second chiplet includes a second front side and a second back side, and
wherein the first back side of the first chiplet is coupled to the second metallization portion through a second plurality of solder interconnects, and
wherein the second front side of the second chiplet is coupled to and touch the second metallization portion.

13. The package of claim 11, wherein the first chiplet and the second chiplet are configured to be coupled to a power distribution network.

14. A device comprising:
a package comprising:
a substrate comprising at least one dielectric layer and a plurality of interconnects;
a bridge located at least partially in the substrate, wherein the bridge comprises:
a bridge substrate;
a plurality of bridge interconnects; and
a bridge dielectric layer;

a first chiplet coupled to the substrate and the bridge,
wherein a first set of solder interconnects from a first plurality of solder interconnects touch the first chiplet and a first set of interconnects from the substrate, and
wherein a second set of solder interconnects from the first plurality of solder interconnects touch the first chiplet and a first set of bridge interconnects from the bridge;
a second chiplet coupled to the substrate and the bridge,
wherein a first set of solder interconnects from a second plurality of solder interconnects touch the second chiplet and a second set of interconnects from the substrate, and
wherein a second set of solder interconnects from the second plurality of solder interconnects touch the second chiplet and a second set of bridge interconnects from the bridge;
an encapsulation layer coupled to the substrate, the first chiplet and the second chiplet;
a plurality of encapsulation interconnects located in the encapsulation layer, wherein at least one encapsulation interconnect is coupled to and touches a bridge interconnect from the bridge;
a metallization portion coupled to the encapsulation layer and the plurality of encapsulation interconnects; and
a first integrated device coupled to the metallization portion.

15. The device of claim 14,
wherein the first chiplet includes a first front side and a first back side, and
wherein the first front side of the first chiplet is coupled to the bridge located at least partially in the substrate through the first set of solder interconnects from the first plurality of solder interconnects.

16. The device of claim 14, wherein at least one other encapsulation interconnect from the plurality of encapsulation interconnects is coupled to the first back side of the first chiplet.

17. The device of claim 14, wherein at least one other encapsulation interconnect from the plurality of encapsulation interconnects is coupled to a back side of the second chiplet.

18. The device of claim 14, wherein the first chiplet is configured to be coupled to a power distribution network.

19. The device of claim 14, wherein the first chiplet and/or the second chiplet includes a deep trench capacitor.

20. The device of claim 14, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

\* \* \* \* \*